(12) United States Patent
Kim et al.

(10) Patent No.: US 9,083,311 B2
(45) Date of Patent: Jul. 14, 2015

(54) APPARATUS HAVING DOUBLE PHASE-MATCHED CONFIGURATION FOR REDUCING MAGNITUDE OF INTERMODULATION PRODUCTS

(75) Inventors: Won Kyu Kim, Seoul (KR); David A. Feld, Newark, CA (US); Paul Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 478 days.

(21) Appl. No.: 13/341,797

(22) Filed: Dec. 30, 2011

(65) Prior Publication Data

US 2013/0169378 A1    Jul. 4, 2013

(51) Int. Cl.
*H01P 5/12* (2006.01)
*H03H 7/46* (2006.01)
*H03H 9/70* (2006.01)

(52) U.S. Cl.
CPC .. *H03H 7/46* (2013.01); *H03H 9/70* (2013.01)

(58) Field of Classification Search
CPC .................................. H03H 7/46; H03H 9/70
USPC .................................. 333/126, 132, 134, 136
See application file for complete search history.

(56) References Cited

U.S. PATENT DOCUMENTS

| | | | |
|---|---|---|---|
| 3,805,285 A | 4/1974 | Kinjo et al. | |
| 5,587,620 A | 12/1996 | Ruby | |
| 5,873,153 A | 2/1999 | Ruby et al. | |
| 6,107,721 A | 8/2000 | Lakin | |
| 6,507,983 B1 | 1/2003 | Ruby et al. | |
| 7,403,758 B2 | 7/2008 | Rector | |
| 7,646,260 B2 | 1/2010 | Prikhodko et al. | |
| 8,150,350 B2 | 4/2012 | Pratt et al. | |
| 2006/0001506 A1 | 1/2006 | Razmpoosh | |
| 2006/0066419 A1 | 3/2006 | Iwaki et al. | |
| 2008/0122554 A1 | 5/2008 | Harada et al. | |
| 2009/0315640 A1 | 12/2009 | Umeda et al. | |

(Continued)

FOREIGN PATENT DOCUMENTS

WO    WO2012041739    9/2011

OTHER PUBLICATIONS

Gregory James Mazzaro, "Time-frequency Effects in Wireless Communication Systems", http://www.lib.ncsu.edu/resolver/1840.16/4523, Issue Date: Oct. 5, 2009, pp. 1-241.

(Continued)

*Primary Examiner* — Stephen E Jones
*Assistant Examiner* — Scott S Outten

(57) ABSTRACT

An apparatus includes: a first apparatus port receiving a first signal having a first frequency; a second apparatus port outputting the first signal having the first frequency; a first passive device connected between the first and second apparatus ports; a second passive device connected between the first and second apparatus ports; a plurality of phase shifters each providing a corresponding phase shift, wherein at least one of the phase shifters provides its phase shift in a first signal path between the first and second apparatus ports through the first passive device, and wherein at least another phase shifter provides its phase shift in a second signal path between the first and second apparatus ports through the second passive device. The phase shifts are selected to cancel an upper or lower intermodulation product between the first signal and a second signal having a second frequency received at the second apparatus port.

49 Claims, 11 Drawing Sheets

(56) References Cited

U.S. PATENT DOCUMENTS

| | | |
|---|---|---|
| 2010/0026547 A1 | 2/2010 | Weissman et al. |
| 2011/0169589 A1* | 7/2011 | Franzon et al. ............... 333/134 |
| 2011/0190028 A1 | 8/2011 | Hahn et al. |
| 2011/0299162 A1 | 12/2011 | Chen et al. |
| 2012/0146698 A1 | 6/2012 | Caron |
| 2012/0146699 A1 | 6/2012 | Caron |
| 2012/0146742 A1 | 6/2012 | Caron et al. |
| 2012/0182086 A1 | 7/2012 | Hase et al. |
| 2012/0238230 A1 | 9/2012 | Tombak et al. |
| 2012/0243447 A1 | 9/2012 | Weissman et al. |
| 2013/0169378 A1 | 7/2013 | Kim et al. |

OTHER PUBLICATIONS

Machine translation of WO2012041739.

* cited by examiner

APPARATUS HAVING DOUBLE PHASE-MATCHED CONFIGURATION FOR REDUCING MAGNITUDE OF INTERMODULATION PRODUCTS

BACKGROUND

Intermodulation, or intermodulation distortion (IMD), is a multi-tone distortion product that results when two or more signals are present at the input of a non-linear device. In such a device, if the applied signals are pure tone frequencies, then intermodulation products will be generated by the system and can be found at the sum and difference frequencies of the originally applied frequencies. More generally intermodulation products will be found at $nF0+mF1+pF2+ \ldots$, where n, m, and p, ... are integers, and $F0, F1, F2, \ldots$ are the applied frequencies.

Intermodulation products can be a significant problem for many electronic systems, particularly communication systems.

FIG. 1 depicts an example for illustrating intermodulation products being generated by a mixing operation of a passive two-port device 100.

In this document, a passive device is understood to refer to a device that exclusively includes passive components such as resistors, capacitors, inductors, signal traces, crystals, acoustic wave elements (including surface acoustic wave (SAW), bulk acoustic wave (BAW), and film bulk acoustic wave (FBAR) devices, etc. A passive device as described herein does not include active or gain components, such as amplifiers, transistors, etc.

As illustrated in FIG. 1, passive device 100 receives an input signal $x(t)$ having a corresponding frequency domain representation $X(f)$ and outputs from an output port 105 an output signal $y(t)$ having a corresponding frequency domain representation $Y(f)$.

In general, $X(f)$ may include substantial components at several different frequencies and/or over a range of frequencies, but for simplification of explanation, it will be assumed for the remainder of this discussion that that $X(f)$ is essentially a single frequency signal at a first frequency F1.

As also illustrated in FIG. 1, an interfering or jamming signal $j(t)$ having a corresponding frequency domain representation $J(f)$ is coupled to output port 105, for example from a device such an antenna that is connected to output port 105. In general, $J(f)$ may include substantial components at several different frequencies and/or over a range of frequencies, but for simplification of explanation, it will be assumed for the remainder of this discussion that that $J(f)$ is essentially a single frequency signal at a second frequency F2.

The present inventors have appreciated that for at least some passive devices, output port 105 may act as a mixing node whereby the first frequency F1 of the input signal is mixed with the second frequency F2 of the interfering or jamming signal. In that case, the signal $Y(f)$ may have frequency components Fi according to equation (1):

$$Fi = \pm a \cdot F1 \pm b \cdot F2, \text{ where } a \text{ and } b \text{ are integers, and where } a \in (0, \infty), \text{ and } b \in (0, \infty) \quad (1)$$

In the cases where $a \neq 0$ and $b \neq 0$, the resultant frequency component Fi is an intermodulation product, as described above.

In many systems and applications, certain intermodulation products are of greater concern than others. Often, the most important intermodulation products are the $3^{rd}$ (third) order intermodulation products where $a=2$ and $b=1$, and where $a=1$ and $b=2$, namely:

$$F3(Lo) = 2F1 \cdot F2; \text{ and} \quad (2)$$

$$F3(Hi) = 2F2 \cdot F1, \quad (3)$$

where here it is assumed that F2>F1.

For example, when F2=1 GHz and F1=900 MHz, then F3(Lo)=800 MHz, and F3(Hi)=1.1 GHz. As can be seen, these third order intermodulation products have frequencies which fall relatively close to the frequency F1 of the original input signal, and therefore may be difficult to separate from the input signal by filtering, and may be received by receivers that are intended to receive the input signal, etc. Other "odd order" intermodulation products such as $5^{th}$ (fifth) order (e.g., 3F2−2F1 and 3F1−2F2), $7^{th}$ (seventh) order (e.g., 4F2−3F1 and 4F1−3F2), etc. and higher order intermodulation products may also include frequencies that are relatively close to the original frequency of the input signal, however the magnitude of these products is typically substantially less than the magnitudes of the third order IM products.

FIG. 2 depicts an example for illustrating intermodulation products being generated by a mixing operation of a passive three-port device, namely a duplexer 200.

As illustrated in FIG. 2, duplexer 200 receives at a transmit input port 201 a transmit signal $x_T(t)$ having a corresponding frequency domain representation $X_T(f)$ which passes through a transmit filter of duplexer 200 and is provided to a common port 205 thereof. In many systems, common port 205 may be connected to an antenna, and so common port 205 is often also referred to as an antenna port. Meanwhile, duplexer 200 receives at common port 205 a signal $z_R(t)$ having a corresponding frequency domain representation $Z_R(f)$ which passes through a receive filter of duplexer 200 and is provided to a receive port 203 thereof as a receive signal $x_R(t)/X_R(f)$.

In general, both $X_T(f)$ and $X_R(f)$ may include substantial components at several different frequencies and/or over a range of frequencies, but for simplification of explanation, it will be assumed for the remainder of this discussion that the portions of $X_T(f)$ and $X_R(f)$ that are of interest are each essentially single frequency signals at first and second frequencies F1 and F2, respectively.

As also illustrated in FIG. 2, an interfering or jamming signal $j(t)$ having a corresponding frequency domain representation $J(f)$ may also be coupled to common port 205, for example from an antenna that is connected to common port 205. In general, $J(f)$ may include substantial components at several different frequencies and/or over a range of frequencies, but for simplification of explanation, it will be assumed for the remainder of this discussion that that the portions $J(f)$ that is of interest is essentially a single frequency signal at a third frequency F3.

The present inventors have appreciated that for at least some three-port devices, common port 205 may act as a mixing node whereby the first frequency F1 of the transmit signal is mixed with the third frequency F3 of the interfering or jamming signal. There may also be "internal" mixing nodes which are internal to duplexer 200 and whose mixing products could pass through to common port 205. In that case, XR(f)) appearing at receive port 203 may include intermodulation products of F1 and F3, i.e., $\pm a \cdot F1 \pm b \cdot F3$, where a and b are integers, and where a $(0, \infty)$, and b $(0, \infty)$.

Some of the frequency components comprising these intermodulation products may fall within the reception band—a band which is being received by the receiver circuitry that may be connected to receive port 203. In that case, these intermodulation products become interfering signals for reception of the desired signal $x_R(t)/X_R(f)$. To address this problem, some existing apparatuses may try to use filtering to eliminate or reduce the magnitude of the jamming signal. For example a notch filter may be placed at the ANT port of such a duplexer to pass the transmit and receive signals while notching out (blocking) the jammer signal. However, when the jamming signal is located close in frequency to the desired signal(s) to be processed, the required notch filter—in order to reject the undesired jammer—will typically have a high insertion loss, which is undesirable, and in some cases will also give rise to its own $3^{rd}$ order IM generation. Another complicating factor is that the notch filter may need to be tunable to be able to reject the undesired jammer while passing the desired transmit and receive signals. Such a notch filter would need to be simultaneously tunable, linear, and highly frequency selective.

What is needed, therefore, is an arrangement for reducing, removing, or eliminating one or more intermodulation products that may be generated by a mixing operation of a passive device without the use of a high insertion loss filter.

SUMMARY

In one aspect of the invention, an apparatus comprises: a first apparatus port configured to receive a first signal having a first frequency; a second apparatus port configured to output the first signal having the first frequency; a first passive device connected between the first and second apparatus ports; a second passive device connected between the first and second apparatus ports; a plurality of phase shifters each configured to provide a corresponding phase shift, wherein at least one of the phase shifters is configured to provide its corresponding phase shift in a first signal path between the first and second apparatus ports through the first passive device, and wherein at least another of the phase shifters is configured to provide its corresponding phase shift in a second signal path between the first and second apparatus ports through the second passive device, wherein the phase shifts are selected to cancel one of an upper or lower intermodulation product between the first signal, and a second signal having a second frequency received at the second apparatus port.

In one or more embodiments, the phase shifts may be selected to cancel one of an upper or lower third order intermodulation product between the first signal and the second signal.

In one or more embodiments, the phase shifts may be selected to cancel one of an upper or lower Nth order intermodulation product between the first signal and the second signal, where N is an odd number greater than 3.

In one or more embodiments, the first and second passive devices each may have a corresponding first device port and a corresponding second device port, and wherein the plurality of phase shifters are configured to provide: a first phase shift between the first apparatus port and the first device port of the first passive device; and a second phase shift between the second apparatus port and the second device port of the second passive device.

According to one optional feature of these embodiments, the first and second phase shifts may each be approximately +90 degrees or −90 degrees at the first frequency.

According to one optional feature of these embodiments, the first and second phase shifts may each be approximately +45 degrees or −45 degrees at the first frequency.

In one or more embodiments, the first and second passive devices may each have a corresponding first device port and a corresponding second device port, and wherein the plurality of phase shifters are configured to provide: a negative phase shift of a defined phase angle at the first frequency between the first port of the apparatus and the first device port of the first passive device; a positive phase shift of the defined phase angle at the first frequency between the first port of the apparatus and the first device port of the second passive device; a positive phase shift of the defined phase angle at the first frequency between the second port of the apparatus and the second port of the first passive device; and a negative phase shift of the defined phase angle at the first frequency between the second port of the apparatus and the second port of the second passive device.

According to one optional feature of these embodiments, the defined phase angle may be approximately 45 degrees.

According to one optional feature of these embodiments, the defined phase angle may be approximately 22.5 degrees.

In one or more embodiments, each of the first and second passive devices is a filter.

In one or more embodiments, the first and second passive devices may have approximately the same S-parameters as each other.

According to one optional feature of these embodiments, the apparatus may have S-parameters which are approximately the same as the S-parameters of the first and second passive devices.

In one or more embodiments, the first passive device and the second passive device may be configured to apply a same phase shift as each other at the first frequency.

In one or more embodiments, the apparatus may further comprise a transmit amplifier coupled to the first port of the apparatus and configured to provide the first signal to the first port of the apparatus.

According to one optional feature of these embodiments, the apparatus may further comprise an antenna coupled to the second port of the apparatus and configured to receive the first signal from the second port of the apparatus.

In one or more embodiments, the apparatus may further comprise at least one circulator connected between at least one of the phase shifters and at least one of the first and second apparatus ports.

In one or more embodiments, the apparatus may further comprise at least one power splitter/combiner connected between at least one of the phase shifters and at least one of the first and second apparatus ports, wherein the splitter/combiner is configured to split a single signal path into two signals paths such that in a reverse direction a differential mode is absorbed.

In another aspect of the invention, an apparatus comprises: a first apparatus port configured to receive a first signal having a first frequency; a second apparatus port; a third apparatus port configured to output the first signal having the first frequency and to receive a second signal having a second frequency, wherein the second apparatus port is configured to output the second signal having the second frequency; first, second, third, and fourth passive devices, each having a corresponding first device port and a corresponding second device port, wherein the second device ports of the first and third passive devices are connected together with a first impedance matching device and the second device ports of the second and fourth passive devices are connected together with a second impedance matching device, a plurality of phase shifters each configured to provide a corresponding phase shift, wherein at least one of the phase shifters is configured to provide its corresponding phase shift in a first signal path between the first and third apparatus ports through the first passive device, wherein at least another of the phase shifters is configured to provide its corresponding phase shift in a second signal path between the first and third apparatus ports through the second passive device, wherein still another of the phase shifters is configured to provide its corresponding phase shift in a third signal path between the second and third apparatus ports through the third passive device, and wherein yet another of the phase shifters is configured to provide its corresponding phase shift in a fourth signal path between the second and third apparatus ports through the fourth passive device; wherein the phase shifts are selected to cancel one of an upper or lower intermodulation product between the first signal, and a third signal having a third frequency received at the third apparatus port In one or more embodiments, the phase shifts may be selected to cancel one of an upper or lower third order intermodulation product between the first signal and the second signal.

In one or more embodiments, the phase shifts may be selected to cancel one of an upper or lower Nth order intermodulation product between the first signal and the second signal, where N is an odd number greater than 3.

In one or more embodiments, the first, second, third and fourth passive devices may each have a corresponding first device port and a corresponding second device port, and wherein the plurality of phase shifters are configured to provide: a first phase shift between the first apparatus port and the first device port of first passive device; a second phase shift between the second apparatus port and the first device port of third passive device; and a third phase shift between the second impedance matching element and third apparatus port, wherein the first phase shift, second phase shift, and third phase shift are all approximately equal to each other.

In one optional feature of these embodiments, the first, second and third phase shifts may each be approximately +90 degrees or −90 degrees the first frequency.

In one optional feature of these embodiments, the first, second and third phase shifts may each be approximately +45 degrees or −45 degrees at the first frequency.

In one or more embodiments, the first, second, third, and fourth passive devices each have a corresponding first device port and a corresponding second device port, and wherein the plurality of phase shifters are configured to provide: a positive phase shift of a defined phase angle at the first frequency between the first apparatus port and the first device port of first passive device; a negative phase shift of the defined phase angle at the first frequency between the first apparatus port and the first device port of second passive device; a positive phase shift of the defined phase angle at the first frequency between the second apparatus port and the first device port of third passive device; a negative phase shift of the defined phase angle at the first frequency between the second apparatus port and the first device port of fourth passive device; a negative phase shift of the defined phase angle at the first frequency between the first impedance matching device and the third apparatus port; and a positive phase shift of the defined phase angle at the first frequency between the second impedance matching device and the third apparatus port.

In one optional feature of these embodiments, the defined phase angle may be approximately 45 degrees.

In one optional feature of these embodiments, the defined phase angle may be approximately 22.5 degrees.

In one or more embodiments, the apparatus may further comprise at least one circulator connected between at least one of the phase shifters and at least one of the first, second and third apparatus ports.

In one or more embodiments, the apparatus may further comprise at least one power splitter/combiner connected between at least one of the phase shifters and at least one of the first, second and third apparatus ports, wherein the splitter/combiner is configured to split a single signal path into two signals paths such that in a reverse direction a differential mode is absorbed.

In one or more embodiments, the first and second passive devices may be transmit filters, and the third and fourth passive devices may be receive filters.

In one or more embodiments, the apparatus may be a filter, a duplexer, or a quadraplexer with differential receive ports.

In one or more embodiments, the apparatus may further comprise: a fourth apparatus port; and fifth and sixth passive devices each having a corresponding first device port and a corresponding second device port, wherein the second device port of the fifth passive device is connected to the first impedance matching device, and wherein the second device port of the sixth passive device is connected to the second impedance matching device.

In one optional feature of these embodiments, the apparatus may further comprise: a first pull down device connected to first impedance matching device, and a second pull down device connected to second impedance matching device, wherein the first and second pull down devices reduce a voltage of the third signal at the third frequency at the second device ports of the first and second devices.

In one optional feature of these embodiments, the plurality of phase shifters may be configured to provide: a first phase shift between the first apparatus port and the first device port of first passive device; a second phase shift between the second apparatus port and the first device port of third passive device; a third phase shift between the second impedance matching element and third apparatus port; and a fourth phase shift between fourth apparatus port and the first device port of the fifth passive device, wherein the first phase shift, second phase shift, third phase shift, and fourth phase shift are all approximately equal to each other.

In one optional feature of these embodiments, the first, second and third phase shifts may each be approximately +90 degrees or −90 degrees at the first frequency.

In one optional feature of these embodiments, the first, second, and third phase shifts may each be approximately +45 degrees or −45 degrees at the first frequency.

In one optional feature of these embodiments, the apparatus may further comprise at least one circulator connected between at least one of the phase shifters and at least one of the first, second, third and fourth apparatus ports.

In one optional feature of these embodiments, the apparatus may further comprise at least one power splitter/combiner connected between at least one of the phase shifters and at least one of the first, second, third and fourth apparatus ports, wherein the splitter/combiner is configured to split a single signal path into two signals paths such that in a reverse direction a differential mode is absorbed.

In one optional feature of these embodiments, the plurality of phase shifters may be configured to provide: a positive phase shift of the defined phase angle at the first frequency between the first apparatus port and the first device port of first passive device; a negative phase shift of the defined phase angle at the first frequency between the first apparatus port and the first device port of second passive device; a positive phase shift of the defined phase angle at the first frequency between the second apparatus port and the first device port of third passive device; a negative phase shift of the defined phase angle at the first frequency between the second apparatus port and the first device port of fourth passive device; a negative phase shift of the defined phase angle at the first frequency between the first impedance matching device and the third apparatus port; a positive phase shift of the defined phase angle at the first frequency between the second impedance matching device and the third apparatus port; a positive phase shift of the defined phase angle at the first frequency between the fourth apparatus port and the first device port of fifth passive device; a negative phase shift of the defined phase angle at the first frequency between the fourth apparatus port and the first device port of sixth passive device.

In one optional feature of these embodiments, the defined phase angle may be approximately 45 degrees.

In one optional feature of these embodiments, the defined phase angle may be approximately 22.5 degrees.

In one optional feature of these embodiments, the first and second passive devices may be transmit filters, the third and fourth passive devices may be receive filters, and the fifth and sixth passive devices may be receive filters operating in a different frequency band from first through fourth filters.

In one optional feature of these embodiments, the first, third and fifth passive devices may form a first quadraplexer, and the second, fourth and sixth passive devices may form a second quadraplexer.

In one optional feature of these embodiments, the first and second quadraplexers may have approximately the same S-parameters as each other.

In one optional feature of these embodiments, the apparatus may have S-parameters which are approximately the same as the S-parameters of the first and second quadraplexers.

In one optional feature of these embodiments, the first and third passive devices may form a first duplexer, and the second and fourth passive devices may form a second duplexer.

In one optional feature of these embodiments, the first and second duplexers may have approximately the same S-parameters as each other.

In one optional feature of these embodiments, the apparatus may have S-parameters which are approximately the same as the S-parameters of the first and second duplexers.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, SHF, microwave and even millimeter wave frequencies to the extent that technology permits the devices and circuits disclosed herein to be fabricated and operated at such frequencies. Also, unless otherwise noted, when a first device is said to be connected or coupled to a second device, this encompasses cases where one or more intermediate devices may be employed to connect the two devices to each other. In contrast, when a first device is said to be directly connected or directly coupled to a second device, this encompasses cases where the two devices are connected together without any intervening devices except any necessary electrical wires. As used herein, "approximately" means within ±10%, and "substantially" means at least 90%.

Figure 1:
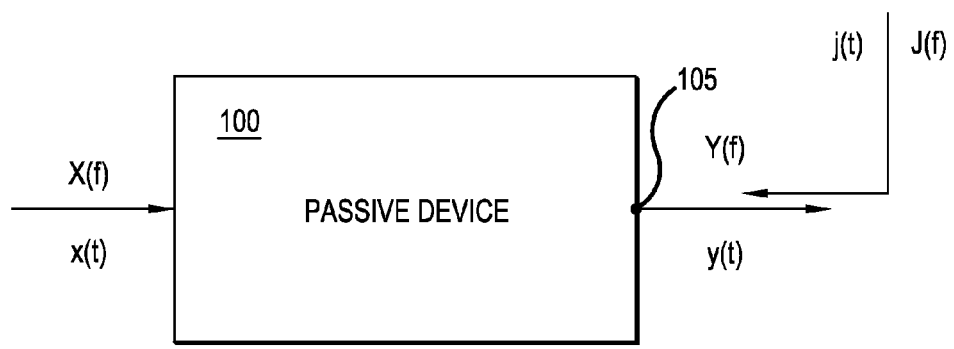
FIG. 1 depicts an example for illustrating intermodulation products being generated by a mixing operation of a passive device.
Figure 2:
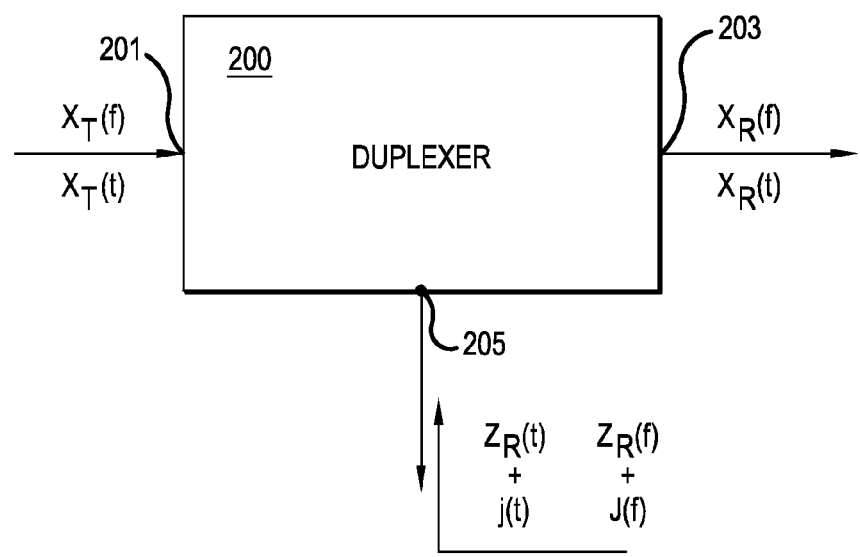
FIG. 2 depicts an example for illustrating intermodulation products being generated by a mixing operation of a duplexer
Figure 3:
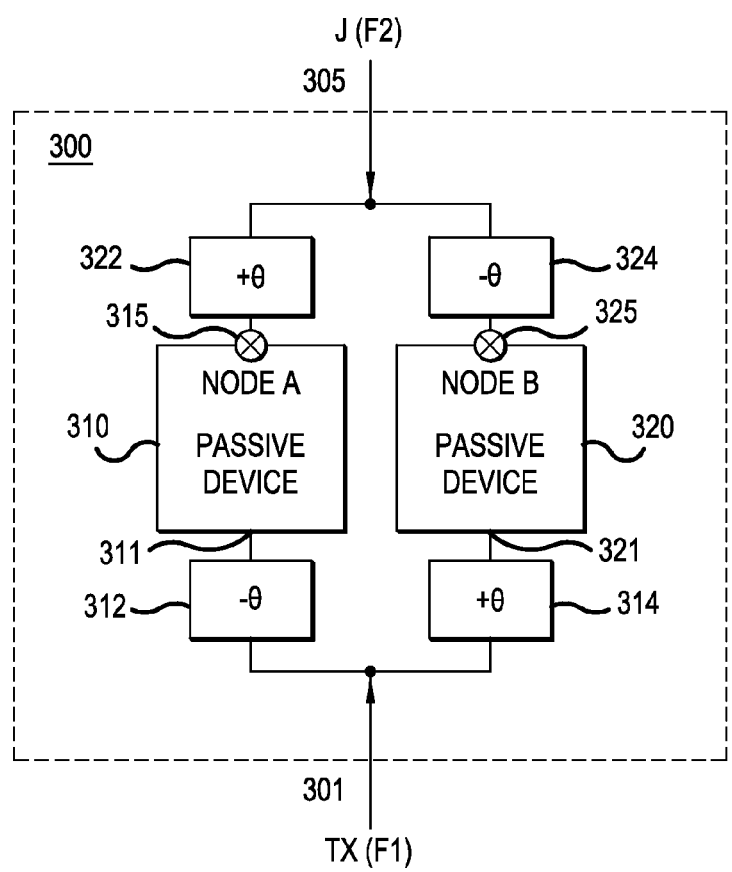
FIG. 3 illustrates a first example embodiment of an apparatus having a double phase-matched configuration.

FIG. 3 illustrates a first example embodiment of an apparatus 300 having a double phase-matched configuration. In various embodiments, apparatus 300 may be a filter, including for example a notch filter.

Apparatus 300 includes: a first apparatus port (e.g., an input port) 301 configured to receive a first (e.g., a transmit, or TX) signal having a first frequency (F1); a second apparatus port (e.g., an output port) 305 configured to output an output signal at the first frequency F1; a first passive device 310 connected between first and second apparatus ports 301 and 305; a second passive device 320 connected between first and second apparatus ports 301 and 305; and phase shifters 312, 314, 322 and 324.

Beneficially, first and second passive devices 310 and 320 each exclusively include passive components such as resistors, capacitors, inductors, signal traces, crystals, acoustic wave elements (including surface acoustic wave (SAW), bulk acoustic wave (BAW), and film bulk acoustic wave (FBAR) devices, etc. Beneficially, first and second passive devices 310 and 320 do not include active components, such as amplifiers, transistors, etc. In some embodiments, passive devices 310 and 320 may each comprise a filter, for example a notch filter, or a resonator. Beneficially, the phase responses of first and second passive devices 310 and 320 are closely matched such that the first (TX) signal experiences the same, or nearly the same, phase shift when it passes through second passive device 320 as it does when passing through first passive device 310.

Phase shifters 312 and 322 are arranged in a first signal path between first and second apparatus ports 301 and 305 through first passive device 310, and phase shifters 314 and 324 are arranged in a second signal path between first and second apparatus ports 301 and 305 through second passive device 320. First passive devices 310 and 320 each have a first device port (e.g., an input port) 311 and 321, respectively, and a second device port (e.g., an output port) 315 and 325 respectively. That is: phase shifter 312 is connected between first apparatus port 301 and first device port 311; phase shifter 314 is connected between first apparatus port 301 and first device port 321; phase shifter 322 is connected between second apparatus port 305 and second device port 315; and phase shifter 324 is connected between second apparatus port 305 and second device port 325.

Phase shifters 312 and 324 are each configured to provide a negative phase shift −θ, and phase shifters 314 and 322 are each configured to provide a positive phase shift +θ. Phase shifters 312, 314, 322 and 324 may employ any convenient technology to realize the desired phase shift, including without limitation, a transmission line, a switched line (delay line) phase shifter, a switched filter phase shifter, a high-pass/low-pass phase shifter, a loaded line phase shifter, a ferroelectric phase shifter, a varactor phase shifter, a Schiffman phase shifter, a Hilbert transform device, etc.

Beneficially, each of the phase shifters 312, 314, 322 and 324 has a low or minimal loss, and it is particularly beneficial if the losses through the phase shifters 312 and 314 closely match each other, and the losses through the phase shifters 322 and 324 also closely match each other.

It should be understood that each of the phase shifters 312, 314, 322 and 324 could be realized with a concatenation of individual phase shifting elements each having their own phase shift amounts that when added together produce the total phase shift of −θ for phase shifters 312 and 324 and +θ for phase shifters 314 and 322.

In some embodiments, first and second passive devices 310 and 320 have the same, or approximately the same, S-parameters as each other. In some embodiments, apparatus 300 has S-parameters which are the same, or approximately the same, as the S-parameters of first and second passive devices 310 and 320.

In operation, a transmit signal TX having the first frequency F1 is provided to first apparatus port 301, for example from a transmit amplifier not shown in FIG. 3. A portion (e.g., 50%) of the transmit signal TX is provided to each of the first device ports 311 and 321 of first and second passive devices 310 and 320 via phase shifters 312 and 314, respectively. First and second passive devices 310 and 320 each output a portion (e.g., 50%) of the transmit signal TX, with some amplitude response (e.g., loss) and phase response applied thereto by the passive devices. Beneficially, first and second passive devices 310 and 320 provide the same, or approximately the same, amplitude response and phase response as each other. First and second passive devices 310 and 320 may perform some operation with respect to the transmit signal TX, for example filtering the transmit signal TX. The portions (e.g., 50%) of the transmit signal TX output by each of first and second passive devices 310 and 320 are combined and output at second apparatus port (output port) 305. It is noted that, beneficially, with the arrangement of phase shifters in apparatus 300, the phase shift of the transmit signal TX through a first signal path including first passive device 310 and phase shifters 312 and 322 is equal or approximately equal to the phase shift of the transmit signal TX through a second signal path including second passive device 320 and phase shifters 314 and 324 such that the transmit signal TX is left intact at second apparatus port (output port) 305.

As illustrated in FIG. 3, an interfering or jamming signal J having a second frequency F2 is coupled to second apparatus port 305 of apparatus 300, for example from a device such an antenna that is connected to second apparatus port 305. In various embodiments, the first frequency F1 of the transmit signal TX and the second frequency F2 of the jamming signal J are each RF or microwave frequencies. In some embodiments, F1 and F2 may be frequencies employed for mobile communication devices, for example mobile telephony devices, such as frequencies employed in various countries for GSM, CDMA, LTE and similar communication systems.

In apparatus 300, a mixing operation between the transmit signal TX at the first frequency F1 and the jamming signal J at the second frequency F2 occurs at each of the second device ports 315 and 325. Also, there may be "internal" mixing nodes, other than device ports 315 and 325, which are internal to passive devices 310 and 320 and whose mixing products could pass through to second apparatus port 305. As a result of the mixing operation(s), intermodulation products are generated between the transmit signal TX at the first frequency F1 and the jamming signal J at the second frequency F2, as described above.

Furthermore, if, for example, passive devices 310 and 320 are band pass filters, then the jamming signal J having the second frequency F2, and the intermodulation signals produced by each filter, would in general have frequencies that could fall below, above, or in the pass band of those filters. Meanwhile, the transmit signal TX having the first frequency F1 would need to pass through both band pass filters largely unattenuated in such an application. Similarly, in a band reject or notch filter application where passive devices 310 and 320 are each band reject or notch filters, the transmit signal TX having the first frequency F1 would need to pass largely unattenuated through each band reject filter, while the jamming signal J having the second frequency F2 would typically reside at a frequency that would fall inside of the reject band of the filter, and that the intermodulation signals produced by each filter would reside at a frequency that could fall above, below, or inside of the reject band.

Beneficially, the phase shifts +θ and −θ are selected to eliminate, or substantially eliminate, at the second apparatus port 305 an upper or lower intermodulation product between the transmit signal TX at the first frequency F1, and the jamming signal J at the second frequency F2. Here an upper intermodulation product refers to an intermodulation product whose frequency is greater than F1 (and also F2, for that matter), and a lower intermodulation product refers to an intermodulation product whose frequency is less than F1 (and also F2), as described above. In particular, the frequencies F1 of the transmit signal TX and F2 of the jamming signal J produce $3^{rd}$ order intermodulation products at two different frequencies FA and FB, where FA=2F1−F2 and FB=2F2−F1. For example, where F1=1 GHz and F2=900 MHZ, then FA would be 1.1 GHz and FB would be 800 MHz. In this example, FA would be the upper $3^{rd}$ order IM product, and FB would be the lower $3^{rd}$ order IM product. On the other hand, if F2 was greater than F1, for example, F1=1 GHz and F2=1.1 GHz, then FA would be 900 MHz and FB would be 1.2 GHz. In this second example, FA would be the lower $3^{rd}$ order IM product, and FB would be the upper $3^{rd}$ order IM product.

In some embodiments, θ may be selected to be approximately λ/8 (45°) at least at the first frequency F1 of the transmit signal TX and frequencies near the first frequency F1, and/or at the second frequency F2 the jamming signal J and frequencies near the second frequency F2, and/or at the frequency of intermodulation product FA and frequencies near FA. In that case, it will be shown that the third order IM product at the frequency FA=2F1-F2 will be canceled at the second apparatus port 305.

In particular, if it is assumed that the phase angle of the transmit signal TX at the first frequency F1 is defined to be zero degrees at the first apparatus port (e.g., input port) 301, and if θ=45°, then the phase $\phi_T$ of the transmit signal TX at second device port 315 will be $\phi_D$−45°, where $\phi_D$ is the phase shift which the transmit signal experiences passing through first passive device 310. Meanwhile if it is assumed that the phase angle of the jamming signal J at the second frequency F2 is defined to be zero degrees at the second apparatus port (e.g., output port) 305, then the phase $\phi_J$ of the jamming signal at second device port 315 will be 45°. So, the phase $\phi_{IMD3}$ of the third order IM product at the frequency FA which is generated at second device port 315 of first passive device 310, will be:

$$\phi_{IMD3}=2\cdot\phi_T-\phi_J=2(\phi_D-45°)-45° \quad (4)$$

When the third order IM product at the frequency FA generated at second device port 315 passes through phase shifter 322, the resulting phase at second apparatus port 305 of the third order IM product generated at second device port 315 is:

$$\phi_{IMD3}=(2\cdot\phi_T-\phi_J=2(\phi-45°)-45°)+45° \quad (5)$$

Meanwhile, the phase $\phi_{IMD3}$ of the third order IM product at the frequency FA which is generated at second device port 325 of second passive device 320, will be:

$$\phi_{IMD3}=2\cdot\phi_T-\phi_J=2(\phi_D+45°)+45° \quad (6)$$

When the third order IM product at the frequency FA generated at second device port 325 passes through phase shifter 324, the resulting phase at second apparatus port 305 of the third order IM product generated at second device port 325 is:

$$\phi_{IMD3}=(2\cdot\phi_T-\phi_J=2(\phi_D+45°)+45°)-45° \quad (7)$$

From equations (5) and (7), it can be seen that at second apparatus port 305, the phase difference $\Delta\phi$ between the third order IM product at the frequency FA generated at second device port 315, and the third order IM product at the frequency FA generated at second device port 325, is:

$$\begin{aligned}\Delta\phi &= [2(\phi_D-45°)-45°)+45°] - [(2(\phi_D+45°)+45°)-45°] \quad (8) \\ &= [2(\phi_D-45°)] - [2(\phi_D+45°)] \\ &= -180°\end{aligned}$$

From equation (8) it can be seen that when $\theta=45°$, then the third order IM product at the frequency FA generated at second device port 315, and the third order IM product at the frequency FA generated at second device port 325, are 180 degrees out of phase at second apparatus port 305.

Therefore, if the amplitudes of the third order IM product at the frequency FA generated at second device port 315 and the third order IM product at the frequency FA generated at second device port 325, are the same or approximately the same as each other, and any signal loss through phase shifters 322 and 324 are approximately the same as each other, then these two third order IM components will cancel, or substantially cancel each other out at second apparatus port 305. This condition can be satisfied if, for example, any loss through phase shifters 312 and 314 are approximately the same as each other, any loss through first and second passive devices 310 and 320 are approximately the same as each other, and any loss through phase shifters 322 and 324 are approximately the same as each other.

As long as the following two conditions are satisfied with respect to the matched or nearly matched devices 310 and 320, the intermodulation products generated by second device ports 315 and 325 and any "internal" mixing nodes of devices 310 and 320, along with phase shifters 312, 314, 322 and 324 with an appropriately selected phase shifts $+\theta/-\theta$, will be sufficient as to give rise to the cancellation, or near cancellation, of an upper (or lower) intermodulation product at output 305. (1) The internal circuitry between every pair of nodes inside of each passive device is identical or near identical in its electrical behavior—that is the impedance (at the frequency F1 of the transmit signal TX, at the frequency F2 of the jamming signal J, and at the intermodulation frequencies FA and FB) is identical between any such pair or nodes in each passive device 310 and 320. As such the power of the transmit signal TX and the jamming signal J that flows to and from every node will be identical in the passive devices 310 and 320. (2) The power which is produced at the intermodulation signal frequencies FA and FB by any circuit element between any pair of nodes within each passive device 310 and 320 is identical or near identical.

An apparatus such as apparatus 300 where phase shifters having appropriate phase shifts are employed to cancel out an upper or lower intermodulation product at one of the apparatus ports is referred to here as having a double phase-matched configuration. This should be distinguished from a double balanced configuration, such as is employed in a double balanced mixer. For example, in general a double balanced mixer is a three-port device which receives an RF signal at a first port, and a local oscillator (LO) signal at a second port, and which outputs at a third port a mixed signal which is the product of the RF signal and the LO signal. The double balanced mixer suppresses the power of both the RF signal and the LO signal appearing at the third port, while passing the mixed tones, including the upper and lower intermodulation products, to the third port. In a double balanced mixer, the word "double" refers to the fact that the device includes two baluns which are used to suppress the amount of the RF signal and the LO signal that appear at the third port. In direct contrast to this, in the apparatus 300, for example, it is desired to pass the power of the transmit signal TX to the second apparatus port 305, while suppressing at apparatus port 305 the power of an intermodulation mixing product between the transmit signal TX and the jamming signal J.

From the above discussion, it is seen that by an appropriate selection of $\theta$, the magnitude of the third order IM product at frequency FA appearing at second apparatus port 305 of apparatus 300 having the double phase-matched configuration may be substantially reduced when compared with the magnitude of the third order IM product at frequency FA appearing at the second device port 315 or 325 of any one individual passive device 310 or 320. For example, in some embodiments the ratio between: (1) the magnitude of the transmit signal TX at frequency F1 appearing at second apparatus port 305, and (2) the magnitude of the third order IM product at frequency FA appearing at second apparatus port 305 may be 20 dB or more compared to the ratio between: (1) the magnitude of the transmit signal TX at frequency F1 appearing at second device port 315 or 325, and (2) the magnitude of the third order IM product at frequency FA appearing at second device port 315 or 325.

It should be noted that some of the reduction in the magnitude of the IM products occurs simply due to the splitting of power between the two passive devices 310 and 320. That is, if the devices are not in saturation with respect to the IM products, so that weak nonlinear power dependence applies, the power density of the transmit signal TX and the jamming signal J are each reduced by a factor of two due to splitting transmit signal TX and the jamming signal J into two paths entering two devices, and hence the net magnitude of the IM product produced by the mixers in each device will likely fall by 9 dB relative to a single device. In other words, if the phase shift $\theta$ was set to zero, then the power of the IM products from two passive devices 310 and 320 in parallel with each other would be −6 dB (i.e., −9 dB less per device, multiplied by 2 devices (+3 db)=−6 dB) with respect to the case where a single device were employed. As explained above, by the appropriate choice of phase θ the (lower or upper) IM product can be suppressed much more than by 6 dB. It should also be noted that the cancelation or substantial cancellation of the (lower or upper) IM product using the double phase-matched configuration described above does not require that the device IM products are not in saturation, so that weak nonlinear power dependence applies. As long as the two passive devices 310 and 320 have internal mixers that generate the same level of IM power independent of the power of the transmit signal TX and the jamming signal J, the cancellation will occur if the appropriate phase angle θ is employed. That is, so long as each device 310 and 320 has the same or near the same IM power dependence as a function of the power of the transmit signal TX and the jamming signal J, the cancellation will occur.

The inventors have also discovered that in some embodiments the $3^{rd}$ order IM cancellation described above may be provided to a large degree even when θ is not precisely λ/8 (45°). Indeed, in some embodiments 10 dB reduction of the $3^{rd}$ order IM product at frequency FA has been observed over a range of ±15% with respect to the "ideal" value of θ of λ/8 (45°).

In some embodiments, θ may be selected to be approximately λ/16 (22.5°) at least at the first frequency F1 of the transmit signal TX and frequencies near the first frequency F1, and/or at the second frequency F2 the jamming signal J and frequencies near the second frequency F2, and/or at the frequency of intermodulation product FB and frequencies near FB. In that case, it can be shown using a similar analysis to that performed above, and under similar conditions, that the third order IM product at the frequency FB=2F2-F1 will be canceled, or substantially canceled, at the second apparatus port 305, where again F2 is again a frequency of the jamming signal J. For example, in some embodiments the ratio between: (1) the magnitude of the transmit signal TX at frequency F1 appearing at second apparatus port 305, and (2) the magnitude of the third order IM product at frequency FB appearing at second apparatus port 305 may be improved by 20 dB or more compared to the ratio between: (1) the magnitude of the transmit signal TX at frequency F1 appearing at second device port 315 or 325, and (2) the magnitude of the third order IM product at frequency FB appearing at second device port 315 or 325.

In other embodiments, other values of θ may be selected to cancel, or substantially cancel, an upper or lower $5^{th}$ order IM product, an upper or lower $7^{th}$ order IM product, etc.

Those skilled in the art will appreciate that when apparatus 300 having the double phase-matched configuration is substituted in a larger system in place of a single passive device such as passive device 310 or 320, appropriate measures must be taken to insure that proper impedance matching is maintained. For example, if passive device 310 was employed in a system where an amplifier having a 50Ω output impedance was employed to supply the first signal to the input of a single passive 310, then passive device 310 should have a 50Ω input impedance at first device port 311. In that case, the input impedance of apparatus 300 at first apparatus port 301 would be 50Ω|50Ω=25Ω. To address this issue, some embodiments may employ an impedance matching transformer between the amplifier and first apparatus port 301. Other embodiments may employ modified passive devices 310 and 320 whose impedance has been doubled to 100Ω. A similar discussion applies to the output impedance of passive device 310 and second apparatus port 305.

The present inventors have appreciated that the embodiment illustrated in FIG. 3 can be modified so as to reduce the total number of phase shifters by half. In particular, if the phase shift of each of the phase shifters of FIG. 3 is either increased by θ or decreased by θ, the resultant apparatus may operate substantially similarly to apparatus 300 with respect to the elimination of an intermodulation product at the output port of the apparatus, as described above.

Figure 4:
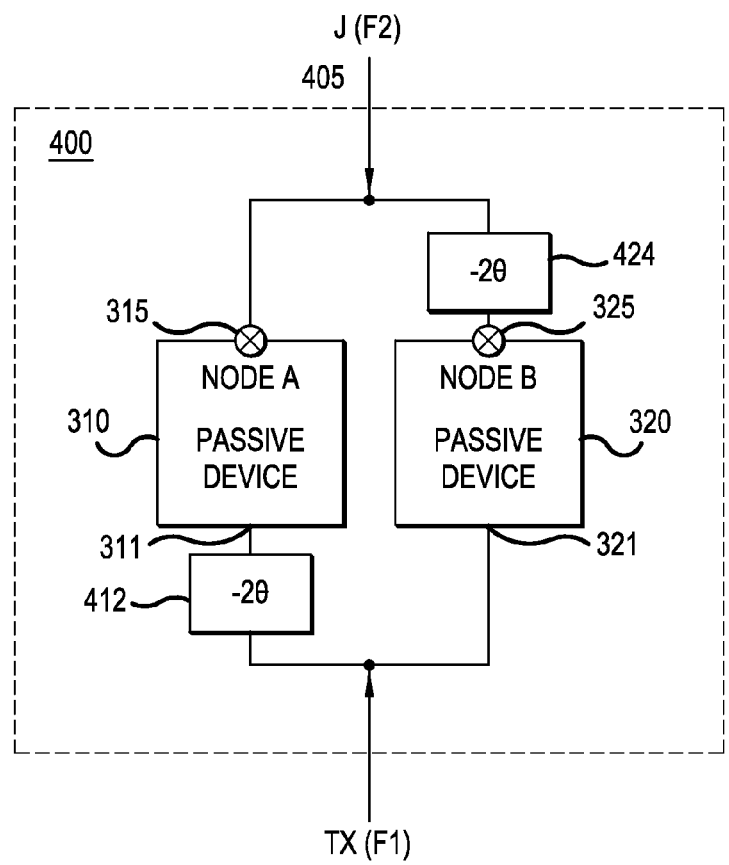
FIG. 4 illustrates a second example embodiment of an apparatus having a double phase-matched configuration.

Accordingly, FIG. 4 illustrates a second example embodiment of an apparatus 400 having a double phase-matched configuration. Apparatus 400 is similar to apparatus 300 shown in FIG. 3, and like elements in FIG. 4 have like reference numerals, and for brevity a description of the portions of apparatus 400 that are the same as apparatus 300 will not be repeated.

As shown in FIG. 4, apparatus 400 has two phase shifters 412 and 424 in contrast to the four phase shifters employed in apparatus 300. Phase shifter 412 has a phase shift of −2θ and phase shifter 424 has a phase shift of +2θ. It will be understood that apparatus 400 may be obtained from apparatus 300 by subtracting θ from the phase shifts of each of the phase shifters in apparatus 300. As a result, two of the phase shifters have a phase shift of zero, and may be eliminated, and θ may be selected, as with apparatus 300, for elimination of an intermodulation product. For example, it can be shown using an analysis similar to that performed above with respect to apparatus 300, that when θ is selected to be 45° in apparatus 400 (i.e., 2θ=90°), then the third order intermodulation product at FA (2F1−F2) appearing at second apparatus port 405 is eliminated, or substantially eliminated, by cancelation of the products produced at the mixing nodes 315 and 325, where again F1 is the frequency of the transmit signal TX and F2 is the frequency of the jamming signal J.

In practice, in some implementations there may be a small penalty to be paid for the elimination of the two phase shifters in apparatus 400 compared to apparatus 300. For example, in general the phase shifters 412 and 424 may provide some small amplitude loss that is not canceled out as in the apparatus 300. If phase shifter 412 has a small loss at the first (transmit) frequency F1, then the amplitudes of the transmit signal TX at the mixing nodes 315 and 325 may be slightly mismatched, thereby degrading the degree of cancelation of the third order IM products at second apparatus port 405. Similarly, if phase shifter 424 has a small loss at the jamming frequency F2, then the amplitudes of the jamming signal J at the mixing nodes 315 and 325 may be slightly mismatched, again degrading the degree of cancelation of the third order IM products at second apparatus port 405.

As with apparatus 300, it is noted that, beneficially, with the arrangement of phase shifters in apparatus 400, the phase shift of the transmit signal TX through a first signal path including first passive device 310 and phase shifter 412 is equal or approximately equal to the phase shift of the transmit signal TX through a second signal path including second passive device 320 and phase shifter 424 such that the transmit signal TX is left intact at second apparatus port 405.

FIG. 4 illustrates an example embodiment produced by subtracting θ from the phase shifts of each of the phase shifters in apparatus 300, thereby eliminating a first pair of the four phase shifters in apparatus 300 (i.e., phase shifters 314 and 322). However, it will be understood by those skilled in the art that another embodiment could be produced by instead adding θ to the phase shifts of each of the phase shifters in apparatus 300. In that case, the other pair of phase shifters (312 and 324) would be eliminated from apparatus 300 instead of the first pair of phase shifters 314 and 322.

Although the apparatuses 300 and 400 split the transmit signal TX between two passive devices 310 and 320, it should be understood that in other embodiments the number of passive devices among with the transmit signal TX is split may be greater than two, with the appropriate phase shifts being applied to each signal path through each of the passive devices.

Figure 5A:
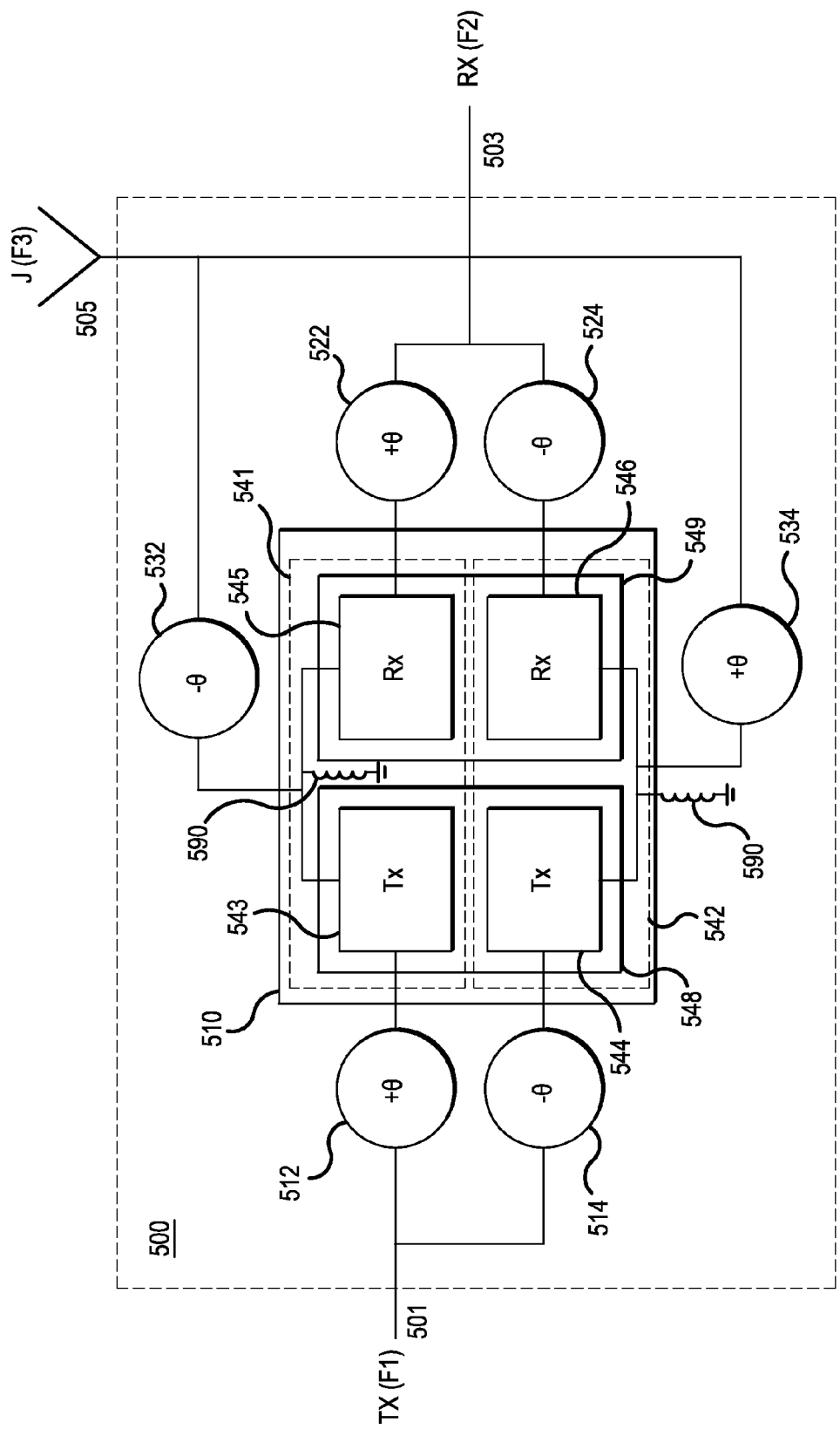
FIG. 5A illustrates a third example embodiment of an apparatus having a double phase-matched configuration.

FIG. 5A illustrates a third example embodiment of an apparatus 500 having a double phase-matched configuration. Apparatus 500 is a three-port apparatus and includes: a first apparatus port 501, a second apparatus port 503, and a third apparatus port 505; first, second, third, and fourth passive devices 543, 544, 545 and 546; and first, second, third, fourth, fifth and sixth phase shifters 512, 514, 522, 524, 532 and 534.

First apparatus port 501 is configured to receive a first signal (e.g., a transmit signal TX) having a first frequency F1. Second apparatus port 503 is configured to output a second signal (e.g., a receive signal RX) having a second frequency F2. Third apparatus port 505 is configured to output the first signal, after processing by apparatus 500, having the first frequency F1 and to receive a signal having the second frequency F2 which it processes to produce the second (receive) signal RX.

Beneficially, first, second, third, and fourth passive devices 543, 544, 545 and 546 each exclusively include passive components such as resistors, capacitors, inductors, signal traces, crystals, acoustic wave elements (including surface acoustic wave (SAW), bulk acoustic wave (BAW), and film bulk acoustic wave (FBAR) devices, etc. First, second, third, and fourth passive devices 543, 544, 545 and 546 do not include active components, such as amplifiers, transistors, etc.

In the example embodiment illustrated in FIG. 5A, first, second, third, and fourth passive devices 543, 544, 545 and 546 each comprise a filter. In particular, first and second passive devices 543 and 544 each comprise a transmit filter for the transmit signal TX, and third and fourth passive devices 545 and 546 each comprise a receive filter for the receive signal RX. In some embodiments, the transmit filters and receive filters may each include a resonator, such as a bulk acoustic wave (BAW) resonator or film bulk acoustic resonator (FBAR).

First, second, third, and fourth passive devices 543, 544, 545 and 546 each have a corresponding first device port and a corresponding second device port. The second device ports of first and third passive devices 543 and 545 are connected together with a first impedance matching device 590 to form a first duplexer 541, and the second device ports of second and fourth passive devices 544 and 546 are connected together with a second impedance matching device 590 to form a second duplexer 542. Together, first and second duplexers 541 and 542 form a dual duplexer 510. Although FIG. 5A shows impedance matching device 590 as an inductor connected to ground, other embodiments may employ a different impedance termination device, for example a transmission line (e.g., a quarter wave line) connected between fourth device 545 and a common node through which the second device ports of first and third passive devices 543 and 545 are connected to phase shifter 532.

Beneficially, the phase responses of first and second passive devices 543 and 544 are closely matched such that the first (TX) signal experiences the same, or nearly the same, phase shift when it passes through second passive device 544 as it does when passing through first passive device 543. Toward that end, in an optional feature of the example embodiment illustrated in FIG. 5A, first and second passive devices 543 and 544 are fabricated on the same die as each other, which may be referred to as a TX die 548. Similarly, third and fourth passive devices 545 and 546 may also fabricated on the same die as each other, which may be referred to as a RX die 549, so as to closely match the characteristics of third and fourth passive devices 545 and 546 to each other.

First, third, and sixth phase shifters 512, 522 and 534 are each configured to provide a positive phase shift +θ, and second, fourth and fifth phase shifters 514, 524 and 532 are each configured to provide a positive phase shift +θ. As with apparatuses 300 and 400, in apparatus 500 first, second, third, fourth, fifth and sixth phase shifters 512, 514, 522, 524, 532 and 534 each may employ any convenient technology to realize the desired phase shift, including without limitation, a transmission line, a switched line (delay line) phase shifter, a switched filter phase shifter, a high-pass/low-pass phase shifter, a loaded line phase shifter, a ferroelectric phase shifter, a varactor phase shifter, a Schiffman phase shifter, a Hilbert transform device, etc.

First, second, third, fourth, fifth and sixth phase shifters 512, 514, 522, 524, 532 and 534 are each configured to provide a corresponding phase shift to a signal or signals that pass therethrough. In particular, first and fifth phase shifters 512 and 532 are each configured to provide a corresponding phase shift in a first signal path between first and third apparatus ports 501 and 505 through first passive device 543. Second and sixth phase shifters 514 and 534 are each configured to provide a corresponding phase shift in a second signal path between first and third apparatus ports 501 and 505 through second passive device 544. Third and fifth phase shifters 522 and 532 are each configured to provide a corresponding phase shift in a third signal path between second and third apparatus ports 503 and 505 through third passive device 545. Fourth and sixth phase shifters 524 and 534 are each configured to provide a corresponding phase shift in a fourth signal path between second and third apparatus ports 503 and 505 through fourth passive device 546.

It should be understood that each of the phase shifters 512, 514, 522, 524, 532 and 534 could be realized with a concatenation of individual phase shifting elements each having their own phase shift amounts that when added together produce a new phase shift of +θ for phase shifters 512, 522 and 534, and −θ for phase shifters 514, 524 and 532.

In some embodiments, first and second duplexers 541 and 542 have the same, or approximately the same, S-parameters as each other. In some embodiments, apparatus 500 has S-parameters which are the same, or approximately the same, as the S-parameters of each of first and second duplexers 541 and 542.

In operation, a first (transmit) signal TX having the first frequency F1 is provided to first apparatus port 501, for example from a transmit amplifier not shown in FIG. 5A. A portion (e.g., 50%) of the transmit signal TX is provided to each of the first device ports of first and second passive devices 543 and 544 via phase shifters 512 and 514, respectively. First and second passive devices 543 and 544 each output a portion (e.g., 50%) of the transmit signal TX, with some amplitude response (e.g., loss) and phase response applied thereto by the passive devices. Beneficially, first and second passive devices 543 and 544 provide the same, or approximately the same, amplitude response and phase response as each other. First and second passive devices 543 and 544 may perform some operation with respect to the transmit signal TX, for example filtering the transmit signal TX in the example embodiment of FIG. 5A. The portions (e.g., 50%) of the transmit signal TX output by each of first and second passive devices 543 and 544 are combined and output at third apparatus port 505. It is noted that, beneficially, with the arrangement of phase shifters in apparatus 500, the phase shift of the transmit signal TX through a first signal path including first passive device 543 and phase shifters 512 and 532 is equal or approximately equal to the phase shift of the transmit signal TX through a second signal path including second passive device 544 and phase shifters 514 and 534 such that the transmit signal TX is left intact at third apparatus port 505.

Meanwhile, a second (receive) signal RX having a second frequency F2 is output from apparatus 500 at second apparatus port 503 to a receiver not shown in FIG. 5A in response to a signal received at third apparatus port 505 and processed by third and fourth passive devices 545 and 546. Beneficially, third and fourth passive devices 545 and 546 each process a portion (e.g., 50%) of the signal received at third apparatus port 505, with provide the same, or approximately the same, amplitude response and phase response as each other. Third and fourth passive devices 545 and 546 may perform some operation to produce the receive signal RX, for example filtering the signal provided from third apparatus port 505 in the example embodiment of FIG. 5A. The signals output by each of third and fourth passive devices 545 and 546 are combined and output at second apparatus port 503 as the receive signal RX. It is noted that, beneficially, with the arrangement of phase shifters in apparatus 500, the received signal through a third signal path including third passive device 545 and phase shifters 522 and 532 is equal or approximately equal to the phase shift of the received signal through a fourth signal path including fourth passive device 546 and phase shifters 524 and 534 such that the receive signal RX is left intact at second apparatus port 503.

As illustrated in FIG. 5A, an interfering or jamming signal J having a third frequency F3 is coupled to third apparatus port 505 of apparatus 500, for example from a device such an antenna that is connected to third apparatus port 505. In various embodiments, the first frequency F1 of the transmit signal TX, the second frequency F2 of the receive signal RX, and the third frequency F3 of the jamming signal J are each RF or microwave frequencies. In some embodiments, F1, F2 and F3 may be frequencies employed for mobile communication devices, for example mobile telephony devices, such as frequencies employed in various countries for GSM, CDMA, LTE and similar communication systems.

A mixing operation between the transmit signal TX at the frequency F1 and the jamming signal J at the frequency F3 occurs at each of the second device ports of devices 543, 544, 545 and 546. As a result of this mixing operation, intermodulation products are generated between the transmit signal at the frequency F1 and the jamming signal J at the frequency F3, and these intermodulation products may appear at the second apparatus port 503 and thereby interfere with reception of the receive signal RX by a receiver connected to second apparatus port 503.

Beneficially, the phase shifts provided by first, second, third, fourth, fifth and sixth phase shifters 512, 514, 522, 524, 532 and 534 may be selected to cancel at second apparatus port 503 one of an upper or lower intermodulation product produced by the transmit signal TX having the frequency F1, and the jamming signal J having the third frequency F3.

In some embodiments, θ may be selected to be approximately λ/16 (22.5°) at least at the first frequency F1 of the transmit signal TX and frequencies near the first frequency F1, and/or at the third frequency F3 the jamming signal J and frequencies near the third frequency F3, and/or at the frequency of intermodulation product FC and frequencies near FC. In that case, it can be shown by an analysis similar to that performed above with respect to apparatus 300 of FIG. 3 that a third order IM product at the frequency FC=2F1−F3 generated at the second device ports of first and third devices 543 and 545 will be 180 degrees out of phase at the second apparatus port 503 with a third order IM product at the frequency FC generated at the second device ports of second and fourth devices 544 and 546.

Therefore, if the amplitudes of the third order IM product at the frequency FC generated at the second device ports of first and third devices 543 and 545, and the third order IM product at the frequency FC generated at the second device ports of second and fourth devices 544 and 546, are the same or approximately the same as each other, and any signal loss through third and fourth passive devices 545 and 546 are approximately the same as each other, then these two third order IM components will cancel, or substantially cancel, each other out. This condition can be satisfied if, for example, any loss through phase shifters 512 and 514 are approximately the same as each other, any loss through first and second passive devices 543 and 544 are approximately the same as each other, any loss through phase shifters 522 and 524 are approximately the same as each other, and any loss through third and fourth passive devices 545 and 546 are approximately the same as each other.

In some embodiments, θ may be selected to be approximately λ/8 (45°) at the first frequency F1 of the transmit signal TX and frequencies near the first frequency F1, and/or at the third frequency F3 the jamming signal J and frequencies near the third frequency F3, and/or at the frequency of intermodulation product FD and frequencies near FD. In that case, it can be shown that, under the same conditions discussed above, the third order IM product at the frequency FD=2F3−F1 will be canceled, or substantially canceled, at the second apparatus port 503.

The present inventors have appreciated that the embodiment illustrated in FIG. 5A can be modified so as to reduce the total number of phase shifters in half. In particular, if the phase shifts of each of the phase shifters of FIG. 5A is either increased by θ or decreased by θ, the resultant apparatus may operate substantially the same as apparatus 500 with respect to the elimination of an intermodulation product at the second apparatus port, as described above.

Figure 5B:
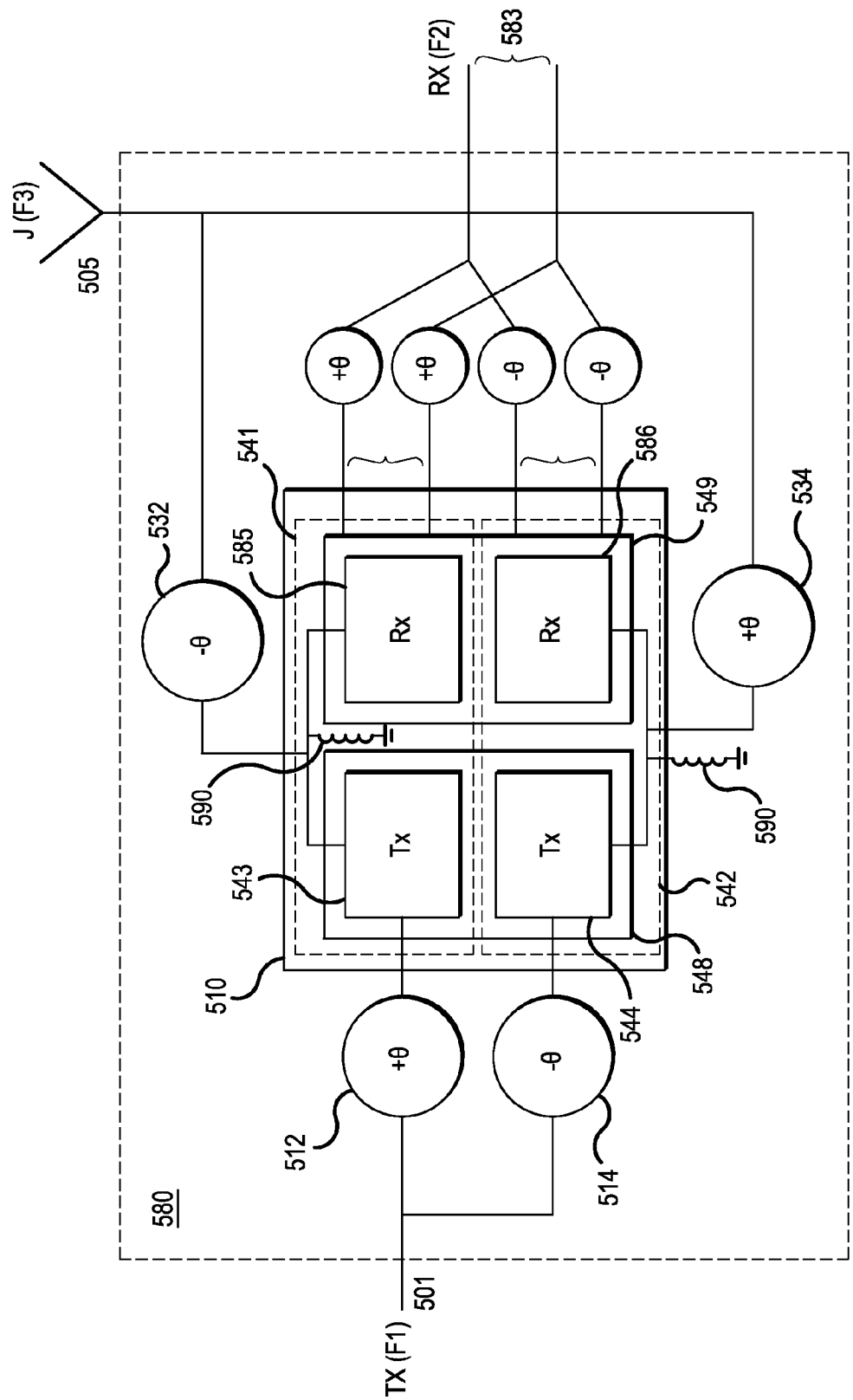
FIG. 5B illustrates a modification of the third example embodiment of an apparatus having a double phase-matched configuration.

In some applications, it may be desired for the receive signal RX to be provided via a differential receive port. Accordingly, FIG. 5B illustrates an example embodiment of an apparatus 580 where each of the third and fourth passive devices 585 and 586 has a differential device port. Each line of the differential device ports has a corresponding phase shifter connected to it, as shown in FIG. 5B. The outputs of these phase shifter are then connected to a differential apparatus port 583, as also shown in FIG. 5B.

Figure 6:
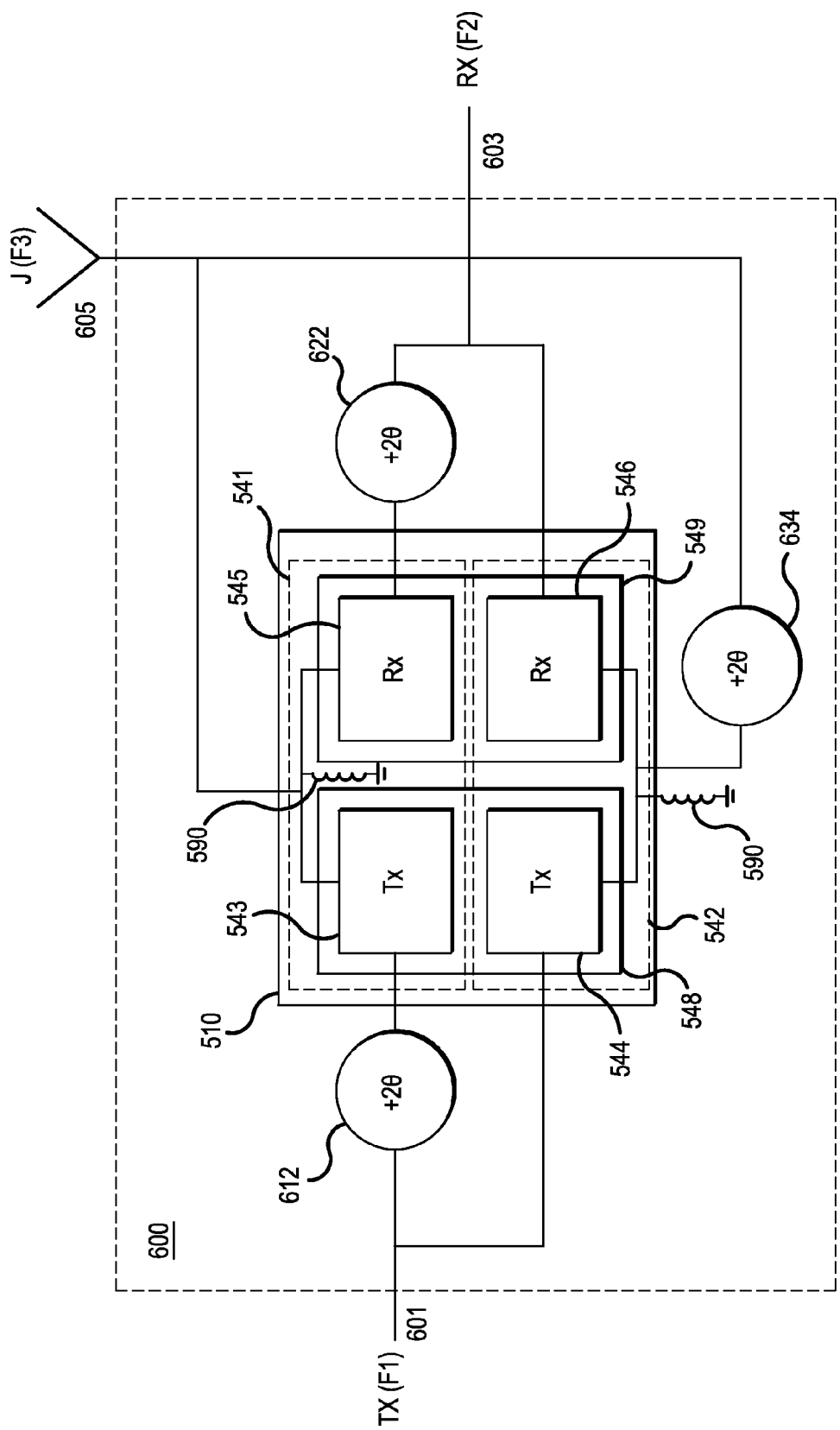
FIG. 6 illustrates a fourth example embodiment of an apparatus having a double phase-matched configuration.

Accordingly, FIG. 6 illustrates a fourth example embodiment of an apparatus 600 having a double phase-matched configuration. Apparatus 600 is similar to apparatus 500 shown in FIG. 5A, and like elements in FIG. 6 have like reference numerals, and for brevity a description of the portions of apparatus 600 that are the same as apparatus 500 will not be repeated.

As shown in FIG. 6, apparatus 600 has three phase shifters 612, 622 and 634 in contrast to the six phase shifters employed in apparatus 500. All of the phase shifters 612, 622 and 634 have a phase shift of +2θ. It will be understood that apparatus 600 may be obtained from apparatus 500 by subtracting θ from the phase shifts of each of the phase shifters in apparatus 500. As a result, three of the phase shifters have a phase shift of zero, and may be eliminated, and θ may be selected, as with apparatus 500, for elimination of an intermodulation product. For example, it can be shown using an analysis similar to that performed above with respect to apparatus 500, that when θ is selected to be 22.5° in apparatus 600 (i.e., 2θ=45°), then the third order intermodulation product at FC (2F1−F3) appearing at second apparatus port 605 may be eliminated or substantially eliminated where, again, F1 is a frequency of the transmit signal TX and F3 is a frequency of the jamming signal J. Similarly, when θ is selected to be 45° in apparatus 600 (i.e., 2θ=90°), then the third order intermodulation product at FD (2F3−F1) appearing at second apparatus port 605 may be eliminated or substantially eliminated where, again, F1 is a frequency of the transmit signal TX and F3 is a frequency of the jamming signal J. As with apparatus 400, it will be understood by those skilled in the art that another embodiment could be produced by instead adding θ to the phase shifts of each of the phase shifters in apparatus 500.

As with apparatus 500, beneficially, with the arrangement of phase shifters in apparatus 600, the phase shift of the transmit signal TX through a first signal path including first passive device 543 and phase shifter 612 is equal or approximately equal to the phase shift of the transmit signal TX through a second signal path including second passive device 544 and phase shifter 634 such that the transmit signal TX is left intact at third apparatus port 605. Furthermore, it is noted that, beneficially, with the arrangement of phase shifters in apparatus 600, the received signal through a third signal path including third passive device 545 and phase shifter 634 is equal or approximately equal to the phase shift of the received signal through a fourth signal path including fourth passive device 546 and phase shifter 634 such that the receive signal RX is left intact at second apparatus port 503.

In some embodiments of apparatuses 500 and 600, propagation mode conversion issues may arise if the there are not proper impedance terminations within the apparatus for both common and differential modes of propagation.

Figure 7:
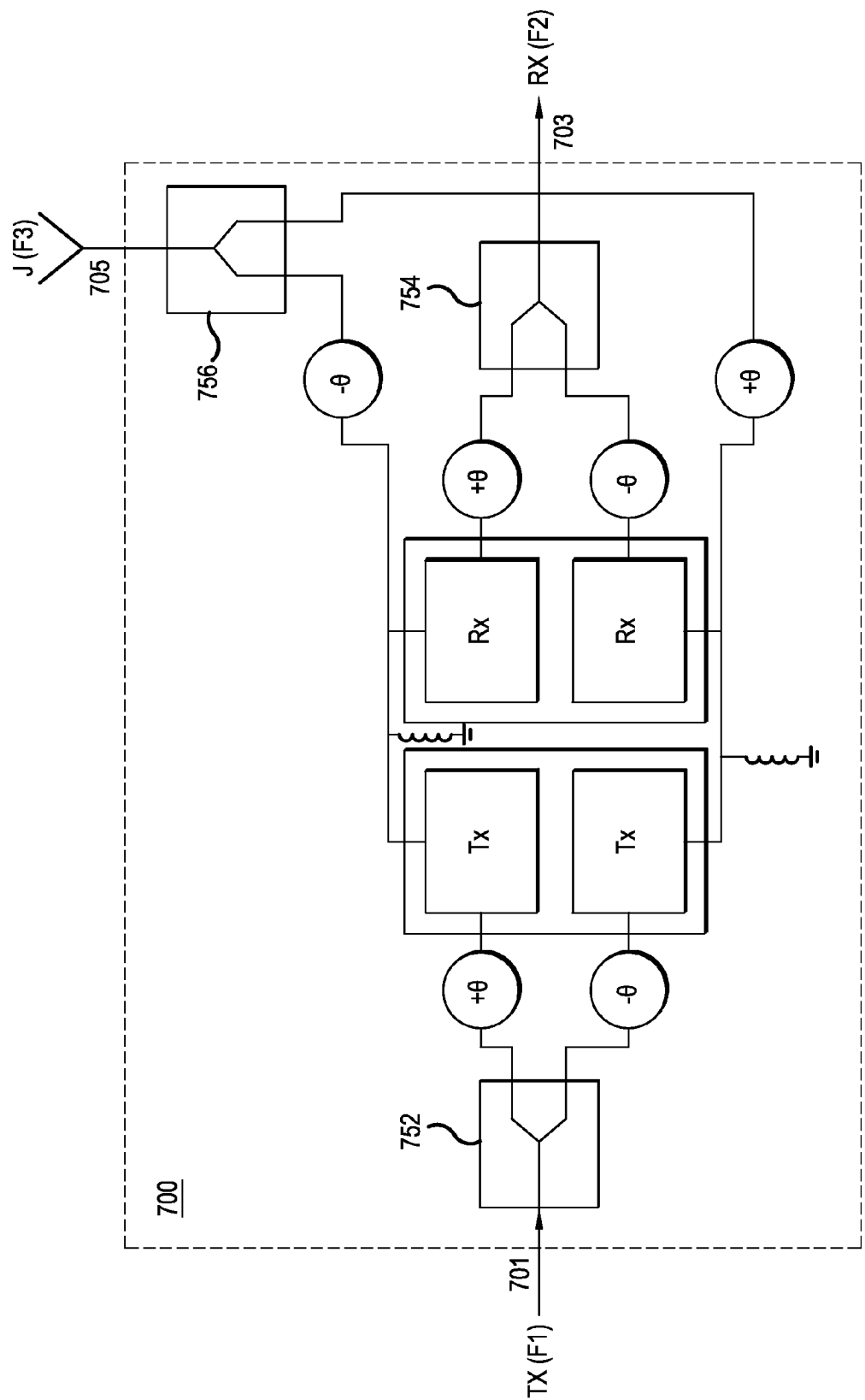
FIG. 7 illustrates a fifth example embodiment of an apparatus having a double phase-matched configuration.

To address this issue, FIG. 7 illustrates a fifth example embodiment of an apparatus 700 having a double phase-matched configuration and a plurality of Wilkinson devices. Apparatus 700 is similar to apparatus 500 shown in FIG. 5A, and for simplification of the illustration, reference numerals of those elements in FIG. 7 that are the same as in FIG. 5A are not repeated in FIG. 7, and only those elements that differ from apparatus 500 are labeled in FIG. 7. Also, for brevity a description of the portions of apparatus 700 that are the same as apparatus 500 will not be repeated.

A principle difference between apparatus 700 and apparatus 500 is that apparatus 700 includes Wilkinson devices 752, 754 and 756 at first, second, and third apparatus ports 701, 703, and 705, respectively. A principal advantage of the inclusion of Wilkinson devices 752, 754 and 756 in apparatus 700 is that they may provide good impedance terminations for both common and differential propagation modes.

Figure 8:
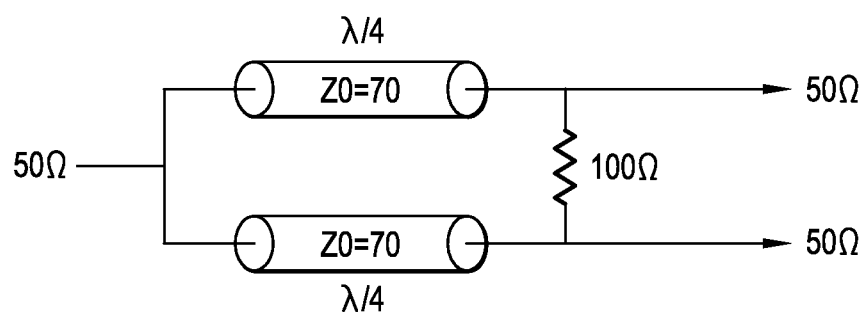
FIG. 8 illustrates one embodiment of a Wilkinson device.

FIG. 8 illustrates one example embodiment of a Wilkinson device which may be employed in apparatus 700 where 50Ω impedance matching is desired. Wilkinson devices are sometimes referred to in the art as Wilkinson combiners or Wilkinson splitters, depending upon their use in a particular apparatus, and are well known in the art, and so a detailed description of their operating theory and principles will not be provided here.

Although FIG. 7 shows an embodiment where Wilkinson devices 752, 754 and 756 are employed, here and throughout this specification when a Wilkinson device is mentioned, in general any type of splitter/combiner in which there is a splitting of a single signal path into two signals paths and such that in the reverse direction the differential mode is absorbed may be employed.

Also, although apparatus 700 includes three Wilkinson devices 752, 754 and 756, other embodiments may only include one or two Wilkinson devices for one or two of the apparatus ports. Additionally, it should be noted that while apparatus 700 is an embodiment similar to apparatus 500 which includes six phase shifters, in other embodiments one or more Wilkinson devices may be added at the apparatus port(s) of apparatus 600 which only includes three phase shifters.

As with apparatus 500, appropriate selections of the phase shift θ in apparatus 700 may allow an upper or lower intermodulation product to be eliminated, or substantially eliminated, at second apparatus port 703. For example, if the phase shift θ is selected to be 22.5° or 45°, an upper or lower third order intermodulation product may be eliminated, or substantially eliminated, at second apparatus port 703.

Figure 9:
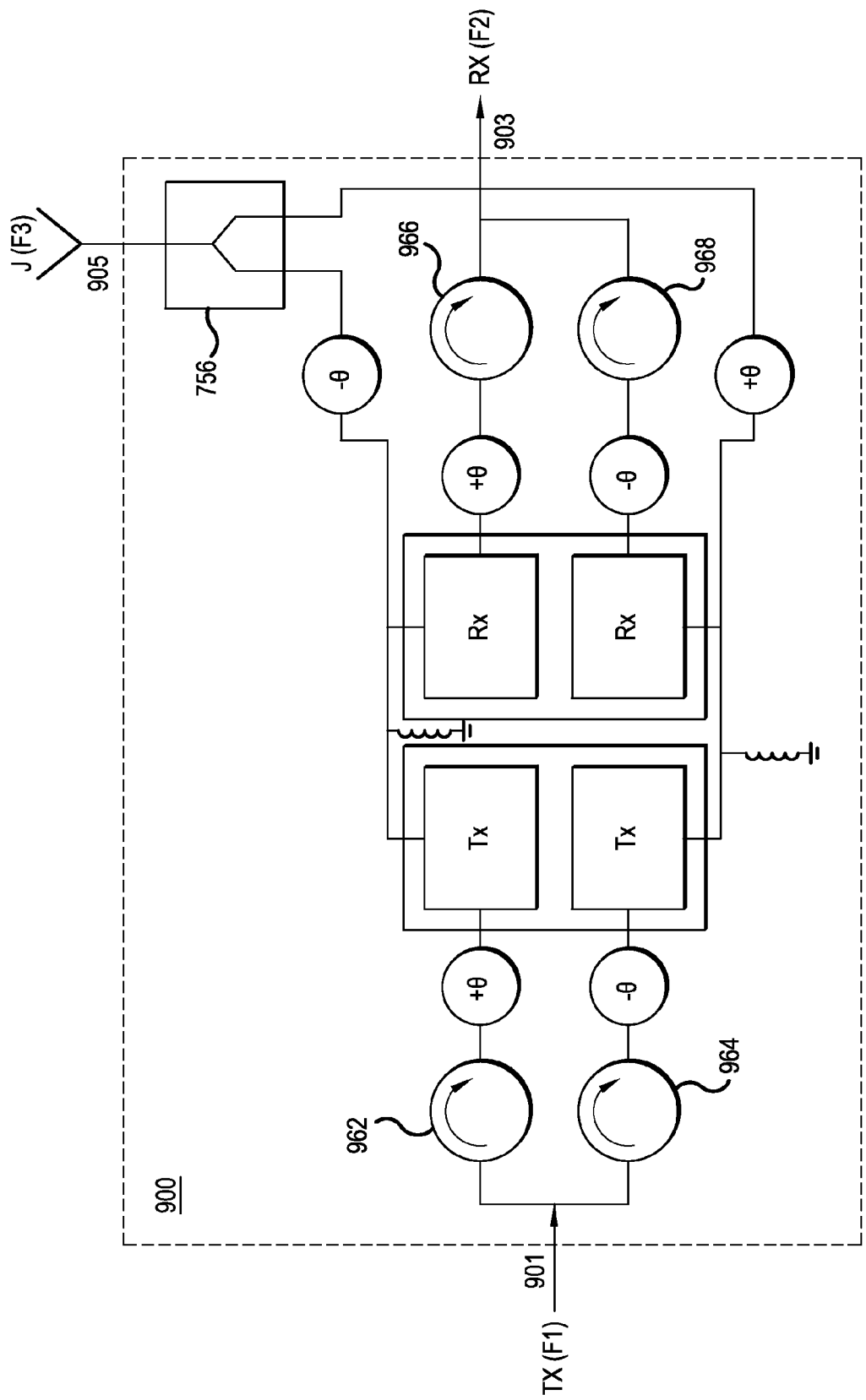
FIG. 9 illustrates a sixth example embodiment of an apparatus having a double phase-matched configuration.

FIG. 9 illustrates a sixth example embodiment of an apparatus 900 having a double phase-matched configuration. Apparatus 900 is similar to apparatus 700 shown in FIG. 7, and only those elements that differ from apparatus 700 are labeled in FIG. 9. Also, for brevity a description of the portions of apparatus 900 that are the same as apparatus 700 will not be repeated.

A principle difference between apparatus 900 and apparatus 700 is that apparatus 900 includes circulators instead of Wilkinson devices 752 and 754 at first and second apparatus ports 901 and 903, respectively. In particular, apparatus 900 includes: a first circulator 962 connected between first apparatus port 901 and first phase shifter 512, which is in turn connected to the first device port of first passive device 543; a second circulator 964 connected between first apparatus port 901 and second phase shifter 514, which is in turn connected to the first device port of second passive device 544; a third circulator 966 connected between second apparatus port 903 and third phase shifter 522, which is in turn connected to the first device port of third passive device 545; and a fourth circulator 968 connected between second apparatus port 903 and fourth phase shifter 524, which is in turn connected to the first device port of fourth passive device 546. A principal benefit of first, second, third and fourth circulators 962, 964, 966 and 968 in apparatus 900 is that they may provide good impedance terminations for both common and differential propagation modes for first and second duplexers 541 and 542.

Apparatus 900 includes: one Wilkinson device 756 connected between the second device ports of first through fourth passive devices 543/544/545/546 (i.e., the "common" or ANT ports of duplexers 541/542) and third apparatus port 905; a pair of circulators 962/964 connected between the first device ports of first and second passive devices 543/544 (i.e., the TX ports of duplexers 541/542) and first apparatus port 901; and another pair of circulators 966/968 connected between the first device ports of third and fourth passive devices 545/546 (i.e., the RX ports of duplexers 541/542) and second apparatus port 904. However, other embodiments may employ omit Wilkinson device 756 or one or more of the pairs of circulators. Indeed various embodiments may employ any desired combination of one or more Wilkinson devices as shown in FIG. 7, and one or more pairs of circulators as shown in FIG. 9 between the various device ports and the apparatus ports. Additionally, it should be noted that while apparatus 900 is an embodiment similar to apparatus 500 which includes six phase shifters, in other embodiments, circulators may be added at the device port(s) of apparatus 600 which only includes three phase shifters.

As with apparatus 500, appropriate selections of the phase shift θ in apparatus 900 may allow an upper or lower intermodulation product to be eliminated, or substantially eliminated, at second apparatus port 903. For example, if the phase shift θ is selected to be 22.5° or 45°, an upper or lower third order intermodulation product may be eliminated, or substantially eliminated, at second apparatus port 903.

Although in general the principles described above for apparatuses 500, 600, 700 and 900 can be applied to general to any three port devices, the specific examples described above were duplexers. The benefits of the double phase-matched configuration of these apparatuses in terms of the elimination or substantial reduction in an intermodulation product can be particularly attractive in certain communication devices, particularly communication devices that employ a wide range of frequencies, including frequencies in different frequency bands. Examples of such devices include mobile communication devices, in particular multiband mobile telephones which may also include data communication capabilities.

Figure 10:
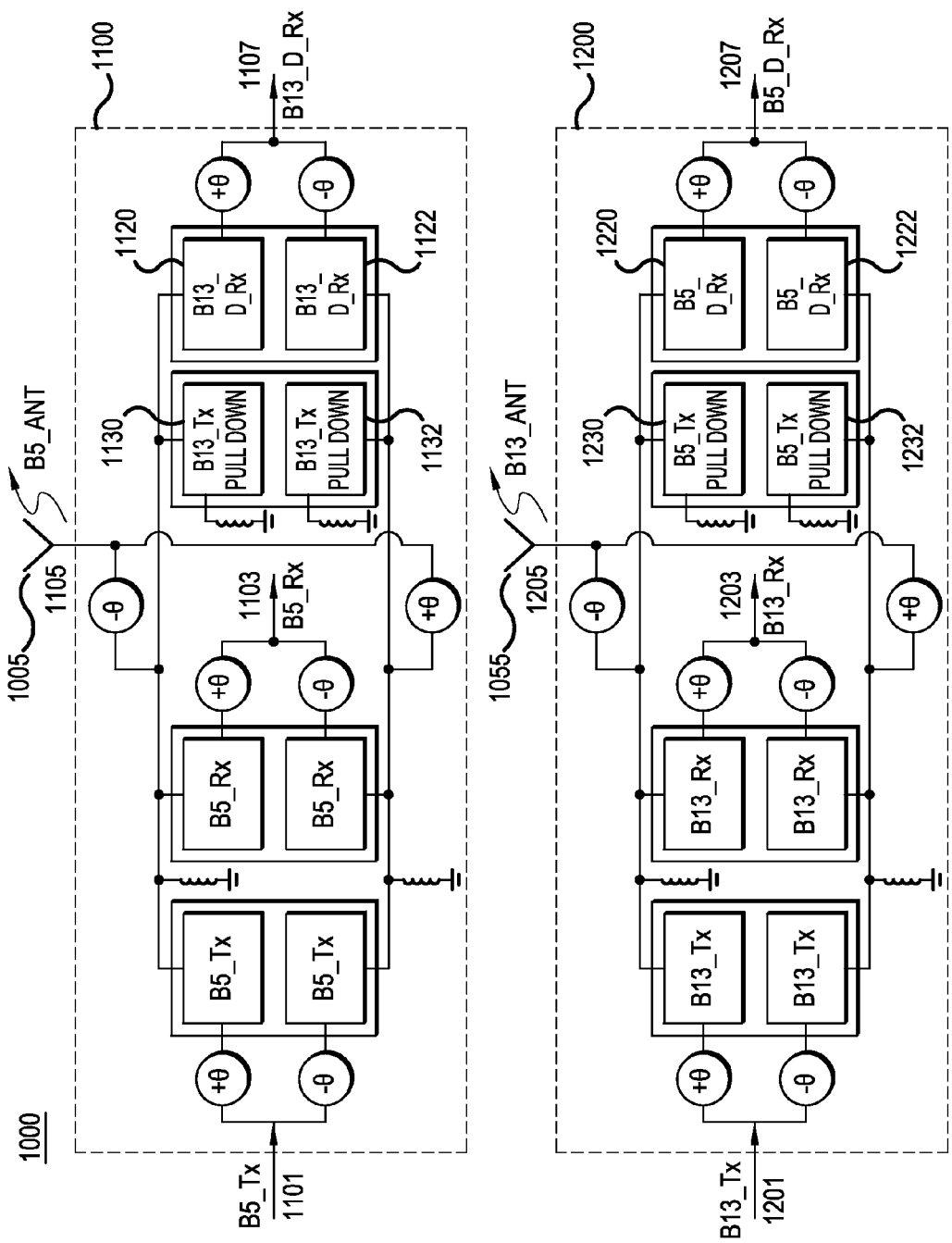
FIG. 10 illustrates a communication device that includes a pair of apparatuses having a double phase-matched configuration.

FIG. 10 illustrates a communication device 1000 that includes a pair of apparatuses each having a double phase-matched configuration. In particular, communication device 1000 is a multi-band mobile telephone which employs frequency diversity and operates in at least two frequency bands, here designated using the frequency band designators B5 and B13 which are conventionally understood in the art.

Communication device 1000 includes a first four-port apparatus 1100 and a second four-port apparatus 1200. First apparatus 1100 and second apparatus 1200 are each quadraplexers.

First apparatus 1100 includes: a first apparatus port 1101 which receives a transmit signal in a first transmit frequency band B5_TX; a second apparatus port 1103 which outputs a receive signal in the first receive frequency band B5_RX; a third apparatus port 1105 which is connected to a first antenna 1005; and a fourth apparatus port 1107 which outputs a diversity receive signal (B13_D_RX) in a second receive frequency band B13_RX. Second apparatus 1200 includes: a first apparatus port 1201 which receives a transmit signal in a second transmit frequency band B13_TX; a second apparatus port 1203 which outputs a receive signal in the second receive frequency band B13_RX; a third apparatus port 1205 which is connected to a second antenna 1055; and a fourth apparatus port 1207 which outputs a diversity receive signal (B5_D_RX) in the first receive frequency band B5_RX.

First and second apparatuses 1100 and 1200 are each similar to apparatus 500 shown in FIG. 5A, and for simplification of the illustration, reference numerals of those elements in FIG. 10 that are the same as in FIG. 5A are not repeated in FIG. 10, and only those elements that differ from apparatus 500 are labeled in FIG. 10. Also, for brevity a description of the portions of apparatuses 1100 and 1200 that are the same as apparatus 500 will not be repeated.

First apparatus 1100 includes fifth and sixth passive devices 1120 and 1122 (e.g., receive filters for the second receive frequency band B13_RX) each having a corresponding first device port and a corresponding second device port, and first and second pull down devices 1130 and 1132. The second device port of fifth passive device 1120 is connected to the first impedance matching device and the second device ports of first and third passive devices 543 and 545 of apparatus 1100, and the second device port of sixth passive device 1122 is connected to the second impedance matching device and the second device ports of second and fourth devices 544 and 546 of apparatus 1100. First pull down device 1130 is connected to the first impedance matching device and the second device ports of first, third and fifth passive devices 543, 545 and 1120. Second pull down device 1132 is connected to the second impedance matching device and the second device ports of second, fourth and sixth passive devices 544, 546 and 1130.

In a case where a jamming or interfering signal J in the second transmit frequency band B13_TX is received at first antenna 1005 (e.g., from second antenna 1055), then first and second pull down devices 1130 and 1132 may reduce a voltage of the jamming or interfering signal at the second device ports of the first, second, third and fourth passive devices 543, 544, 545 and 546. This may reduce one or more intermodulation products at the second apparatus port 1103 produced from mixing of the transmit signal received at first apparatus port 1101 and the jamming or interfering signal J.

Similarly, second apparatus 1200 includes fifth and sixth passive devices 1220 and 1222 (e.g., receive filters for the first receive frequency band B5_RX) each having a corresponding first device port and a corresponding second device port, and first and second pull down devices 1230 and 1232. The second device port of fifth passive device 1220 is connected to the first impedance matching device and the second device ports of first and third passive devices 543 and 545 of apparatus 1200, and the second device port of sixth passive device 1222 is connected to the second impedance matching device and the second device ports of second and fourth devices 544 and 546 of apparatus 1200. First pull down device 1230 is connected to the first impedance matching device and the second device ports of first, third and fifth passive devices 543, 545 and 1220. Second pull down device 1232 is connected to the second impedance matching device and the second device ports of second, fourth and sixth passive devices 544, 546 and 1230.

In a case where a jamming or interfering signal J in the first transmit frequency band B5_TX is received at second antenna 1055 (e.g., from first antenna 1005), then first and second pull down devices 1230 and 1232 may reduce a voltage of the jamming or interfering signal at the second device ports of the first, second, third and fourth passive devices 543, 544, 545 and 546. This may reduce one or more intermodulation products at the second apparatus port 1203 produced from mixing of the transmit signal received at first apparatus port 1201 and the jamming or interfering signal J.

As with apparatus 500, appropriate selection of the phase shift θ in first and second apparatuses 1100 and 1200 may allow an upper or lower intermodulation product to be eliminated, or substantially eliminated, at second apparatus ports 1103 and 1203. For example, if the phase shift θ is selected to be 22.5° or 45°, an upper or lower third order intermodulation product may be eliminated, or substantially eliminated, at second apparatus ports 1103 and 1203.

It will be understood that in other embodiments of a communication device, the apparatuses may include one or more of the variations described above with respect to FIGS. 6, 7 and 9. For example, the apparatuses may include one or more Wilkinson devices as shown in FIG. 7 and/or one or more circulators as shown in FIG. 9. Also, as with the embodiment shown in FIG. 6, half of the phase shifters shown in each apparatus in FIG. 10 may be eliminated by doubling the value of the phase shift.

In similarity to apparatuses 300 and 400, in the apparatuses shown in FIGS. 5, 6, 7, 9 and 10, beneficially, the arrangement of phase shifters is such that the phase shift of the transmit signal TX through the first signal path of the first is equal or approximately equal to the phase shift of the transmit signal TX through the second signal path such that the TX signal is left intact at output port of apparatus port 305.

As described above, two-port, three-port, four-port (or more) port apparatuses may be configured to eliminate, or substantially eliminate, an upper or lower intermodulation product by adopting the double phase-matched configuration as described herein with the inclusion of phase shift devices, and with an appropriate choice of phase shift values for the phase shift devices. For example, some embodiments may exhibit an improvement of 20 dB or more in intermodulation performance without incurring the severe insertion loss penalty that would typically be incurred if a narrow passband or band reject filter was employed to reduce the intermodulation product. Furthermore, in some embodiments a substantial reduction in the magnitude of the intermodulation product may be provided even in cases where the intermodulation product is very close in frequency to a signal that is desired to be processed by the apparatus as a transmit or receive signal. For example, in some embodiments a substantial reduction in the magnitude of the intermodulation product may be provided when this separation is as little as 1 MHz at a nominal frequency of several hundred MHz or more—something that would be difficult or impractical with conventional filtering techniques. Finally, in some embodiments the substantial reduction in the magnitude of the intermodulation product may be relatively insensitive to the actual value selected for the phase shift.

While several example embodiments of apparatuses having a double phase-matched configuration for reducing an intermodulation product are disclosed herein, one of ordinary skill in the art appreciates that many variations that are in accordance with the present teachings are possible and remain within the scope of the appended claims. For example, although one embodiment was described above with respect to FIG. 5B having differential device ports and a differential apparatus port for the receive signal, it should be understood that the other embodiments could be modified similarly to include such differential ports. The embodiments therefore are not to be restricted except within the scope of the appended claims.

The invention claimed is:

1. An apparatus, comprising:
    a first apparatus port configured to receive a first signal having a first frequency;
    a second apparatus port;
    a third apparatus port configured to output the first signal having the first frequency and to receive a second signal having a second frequency, wherein the second apparatus port is configured to output the second signal having the second frequency;
    first, second, third, and fourth passive devices, each having a corresponding first device port and a corresponding second device port, wherein the second device ports of the first and third passive devices are connected together with a first impedance matching device and the second device ports of the second and fourth passive devices are connected together with a second impedance matching device,
    a plurality of phase shifters each configured to provide a corresponding phase shift, wherein at least one of the phase shifters is configured to provide its corresponding phase shift in a first signal path between the first and third apparatus ports through the first passive device, wherein at least another of the phase shifters is configured to provide its corresponding phase shift in a second signal path between the first and third apparatus ports through the second passive device, wherein still another of the phase shifters is configured to provide its corresponding phase shift in a third signal path between the second and third apparatus ports through the third passive device, and wherein yet another of the phase shifters is configured to provide its corresponding phase shift in a fourth signal path between the second and third apparatus ports through the fourth passive device;
    wherein the phase shifts are selected to cancel one of an upper or lower intermodulation product between the first signal, and a third signal having a third frequency received at the third apparatus port.

2. The apparatus of claim 1, wherein the apparatus further comprises:
    a fourth apparatus port; and
    fifth and sixth passive devices each having a corresponding first device port and a corresponding second device port,
    wherein the second device port of the fifth passive device is connected to the first impedance matching device, and wherein the second device port of the sixth passive device is connected to the second impedance matching device.

3. The apparatus of claim 2, wherein the plurality of phase shifters are configured to provide:
    a first phase shift between the first apparatus port and the first device port of first passive device;
    a second phase shift between the second apparatus port and the first device port of third passive device;
    a third phase shift between the second impedance matching element and third apparatus port; and
    a fourth phase shift between fourth apparatus port and the first device port of the fifth passive device,
    wherein the first phase shift, second phase shift, third phase shift, and fourth phase shift are all approximately equal to each other.

4. The apparatus of claim 3, wherein the first, second and third phase shifts are each approximately +90 degrees or −90 degrees at the first frequency.

5. The apparatus of claim 3, wherein the first, second, and third phase shifts are each approximately +45 degrees or −45 degrees at the first frequency.

6. The apparatus of claim 3, further comprising at least one circulator connected between at least one of the phase shifters and at least one of the first, second, third and fourth apparatus ports.

7. The apparatus of claim 3, further comprising at least one power splitter/combiner connected between at least one of the phase shifters and at least one of the first, second, third and fourth apparatus ports, wherein the splitter/combiner is configured to split a single signal path into two signals paths such that in a reverse direction a differential mode is absorbed.

8. The apparatus of claim 2, wherein the plurality of phase shifters are configured to provide:
    a positive phase shift of the defined phase angle at the first frequency between the first apparatus port and the first device port of first passive device;
    a negative phase shift of the defined phase angle at the first frequency between the first apparatus port and the first device port of second passive device;
    a positive phase shift of the defined phase angle at the first frequency between the second apparatus port and the first device port of third passive device;
    a negative phase shift of the defined phase angle at the first frequency between the second apparatus port and the first device port of fourth passive device;
    a negative phase shift of the defined phase angle at the first frequency between the first impedance matching device and the third apparatus port;
    a positive phase shift of the defined phase angle at the first frequency between the second impedance matching device and the third apparatus port;
    a positive phase shift of the defined phase angle at the first frequency between the fourth apparatus port and the first device port of fifth passive device;

a negative phase shift of the defined phase angle at the first frequency between the fourth apparatus port and the first device port of sixth passive device.

9. The apparatus of claim 8, wherein the defined phase angle is approximately 45 degrees.

10. The apparatus of claim 8, wherein the defined phase angle is approximately 22.5 degrees.

11. The apparatus of claim 8, further comprising at least one circulator connected between at least one of the phase shifters and at least one of the first, second, third and fourth apparatus ports.

12. The apparatus of claim 8, further comprising at least one power splitter/combiner connected between at least one of the phase shifters and at least one of the first, second, third and fourth apparatus ports, wherein the splitter/combiner is configured to split a single signal path into two signals paths such that in a reverse direction a differential mode is absorbed.

13. The apparatus of claim 2, wherein the first, third and fifth passive devices form a first quadraplexer, and wherein the second, fourth and sixth passive devices form a second quadraplexer.

14. The apparatus of claim 13, wherein the first and second quadraplexers have approximately the same S-parameters as each other.

15. The apparatus of claim 14, wherein the apparatus has S-parameters which are approximately the same as the S-parameters of the first and second quadraplexers.

16. The apparatus of claim 2, further comprising:
a first pull down device connected to the first impedance matching device, and a second pull down device connected to the second impedance matching device,
wherein the first and second pull down devices reduce a voltage of the third signal at the third frequency at the second device ports of the first and second devices.

17. The apparatus of claim 2, wherein the first and second passive devices are transmit filters, the third and fourth passive devices are receive filters, and the fifth and sixth passive devices are receive filters operating in a different frequency band from first through fourth filters.

18. The apparatus of claim 1, wherein the first and third passive devices form a first duplexer, and wherein the second and fourth passive devices form a second duplexer.

19. The apparatus of claim 18, wherein the first and second duplexers have approximately the same S-parameters as each other.

20. The apparatus of claim 19, wherein the apparatus has S-parameters which are approximately the same as the S-parameters of the first and second duplexers.

21. The apparatus of claim 1, wherein the first, second, third and fourth passive devices each have a corresponding first device port and a corresponding second device port, and wherein the plurality of phase shifters are configured to provide:
a first phase shift between the first apparatus port and the first device port of first passive device;
a second phase shift between the second apparatus port and the first device port of third passive device; and
a third phase shift between the second impedance matching element and third apparatus port,
wherein the first phase shift, second phase shift, and third phase shift are all approximately equal to each other.

22. The apparatus of claim 21, wherein the first, second and third phase shifts are each approximately +90 degrees or −90 degrees at the first frequency.

23. The apparatus of claim 21, wherein the first, second, and third phase shifts are each approximately +45 degrees or −45 degrees at the first frequency.

24. The apparatus of claim 1, wherein the first, second, third, and fourth passive devices each have a corresponding first device port and a corresponding second device port, and wherein the plurality of phase shifters are configured to provide:
a positive phase shift of a defined phase angle at the first frequency between the first apparatus port and the first device port of first passive device;
a negative phase shift of the defined phase angle at the first frequency between the first apparatus port and the first device port of second passive device;
a positive phase shift of the defined phase angle at the first frequency between the second apparatus port and the first device port of third passive device;
a negative phase shift of the defined phase angle at the first frequency between the second apparatus port and the first device port of fourth passive device;
a negative phase shift of the defined phase angle at the first frequency between the first impedance matching device and the third apparatus port; and
a positive phase shift of the defined phase angle at the first frequency between the second impedance matching device and the third apparatus port.

25. The apparatus of claim 24, wherein the defined phase angle is approximately 45 degrees.

26. The apparatus of claim 24, wherein the defined phase angle is approximately 22.5 degrees.

27. The apparatus of claim 1, wherein the phase shifts are selected to cancel one of an upper or lower third order intermodulation product between the first signal and the second signal.

28. The apparatus of claim 1, wherein the phase shifts are selected to cancel one of an upper or lower Nth order intermodulation product between the first signal and the second signal, where N is an odd number greater than 3.

29. The apparatus of claim 1, further comprising at least one circulator connected between at least one of the phase shifters and at least one of the first, second and third apparatus ports.

30. The apparatus of claim 1, further comprising at least one power splitter/combiner connected between at least one of the phase shifters and at least one of the first, second and third apparatus ports, wherein the splitter/combiner is configured to split a single signal path into two signals paths such that in a reverse direction a differential mode is absorbed.

31. The apparatus of claim 1, wherein the first and second passive devices are transmit filters, and the third and fourth passive devices are receive filters.

32. The apparatus of claim 1, wherein the apparatus is a filter, a duplexer, or a quadraplexer with differential receive ports.

33. An apparatus, comprising:
a first apparatus port configured to receive a first signal having a first frequency;
a second apparatus port configured to output the first signal having the first frequency;
a first passive device connected between the first and second apparatus ports;
a second passive device connected between the first and second apparatus ports;
a plurality of phase shifters each configured to provide a corresponding phase shift, wherein at least one of the phase shifters is configured to provide its corresponding phase shift in a first signal path between the first and second apparatus ports through the first passive device, and wherein at least another of the phase shifters is configured to provide its corresponding phase shift in a second signal path between the first and second apparatus ports through the second passive device, wherein the phase shifts are selected to cancel one of an upper or lower intermodulation product between the first signal, and a second signal having a second frequency received at the second apparatus port.

34. The apparatus of claim 33, wherein the first and second passive devices each have a corresponding first device port and a corresponding second device port, and wherein the plurality of phase shifters are configured to provide:
a first phase shift between the first apparatus port and the first device port of the first passive device; and
a second phase shift between the second apparatus port and the second device port of the second passive device.

35. The apparatus of claim 34, wherein the first and second phase shifts are each approximately +90 degrees or −90 degrees at the first frequency.

36. The apparatus of claim 34, wherein the first and second phase shifts are each approximately +45 degrees or −45 degrees at the first frequency.

37. The apparatus of claim 33, wherein the first and second passive devices each have a corresponding first device port and a corresponding second device port, and wherein the plurality of phase shifters are configured to provide:
a negative phase shift of a defined phase angle at the first frequency between the first port of the apparatus and the first device port of the first passive device;
a positive phase shift of the defined phase angle at the first frequency between the first port of the apparatus and the first device port of the second passive device;
a positive phase shift of the defined phase angle at the first frequency between the second port of the apparatus and the second port of the first passive device; and
a negative phase shift of the defined phase angle at the first frequency between the second port of the apparatus and the second port of the second passive device.

38. The apparatus of claim 37, wherein the defined phase angle is approximately 45 degrees.

39. The apparatus of claim 37, wherein the defined phase angle is approximately 22.5 degrees.

40. The apparatus of claim 33, wherein the first and second passive devices have approximately the same S-parameters as each other.

41. The apparatus of claim 40, wherein the apparatus has S-parameters which are approximately the same as the S-parameters of the first and second passive devices.

42. The apparatus of claim 33, further comprising a transmit amplifier coupled to the first port of the apparatus and configured to provide the first signal to the first port of the apparatus.

43. The apparatus of claim 42, further comprising an antenna coupled to the second port of the apparatus and configured to receive the first signal from the second port of the apparatus.

44. The apparatus of claim 33, wherein the phase shifts are selected to cancel one of an upper or lower third order intermodulation product between the first signal and the second signal.

45. The apparatus of claim 33, wherein the phase shifts are selected to cancel one of an upper or lower Nth order intermodulation product between the first signal and the second signal, where N is an odd number greater than 3.

46. The apparatus of claim 33, wherein each of the first and second passive devices is a filter.

47. The apparatus of claim 33, wherein the first passive device and the second passive device are configured to apply a same phase shift as each other at the first frequency.

48. The apparatus of claim 33, further comprising at least one circulator connected between at least one of the phase shifters and at least one of the first and second apparatus ports.

49. The apparatus of claim 33, further comprising at least one power splitter/combiner connected between at least one of the phase shifters and at least one of the first and second apparatus ports, wherein the splitter/combiner is configured to split a single signal path into two signals paths such that in a reverse direction a differential mode is absorbed.

* * * * *